(12) United States Patent
Satake et al.

(10) Patent No.: US 10,273,408 B2
(45) Date of Patent: Apr. 30, 2019

(54) WAVELENGTH CONVERSION MEMBER, BACKLIGHT UNIT INCLUDING WAVELENGTH CONVERSION MEMBER, AND LIQUID CRYSTAL DISPLAY DEVICE

(71) Applicant: FUJIFILM Corporation, Tokyo (JP)

(72) Inventors: Ryo Satake, Kanagawa (JP); Tatsuya Oba, Kanagawa (JP); Hideaki Ito, Kanagawa (JP); Hiroyuki Yoneyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/817,898

(22) Filed: Nov. 20, 2017

(65) Prior Publication Data

US 2018/0072949 A1    Mar. 15, 2018

Related U.S. Application Data

(63) Continuation of application No. PCT/JP2016/002592, filed on May 27, 2016.

(30) Foreign Application Priority Data

May 29, 2015 (JP) ................................. 2015-110908

(51) Int. Cl.
  *F21V 8/00* (2006.01)
  *G02B 5/20* (2006.01)
  (Continued)

(52) U.S. Cl.
  CPC ............ *C09K 11/883* (2013.01); *C09K 11/02* (2013.01); *C09K 11/025* (2013.01); *G02B 5/20* (2013.01);
  (Continued)

(58) Field of Classification Search
  CPC ..... C09K 11/883; C09K 11/02; C09K 11/025; G02B 5/20; G02B 6/005; G02B 6/0055;
  (Continued)

(56) References Cited

U.S. PATENT DOCUMENTS

| | | | | |
|---|---|---|---|---|
| 2008/0185954 | A1* | 8/2008 | Fukuda | ............... H01L 27/3211 313/483 |
| 2010/0264371 | A1* | 10/2010 | Nick | ....................... C09D 7/62 252/301.36 |

(Continued)

FOREIGN PATENT DOCUMENTS

| | | |
|---|---|---|
| CN | 102226064 A | 10/2011 |
| CN | 104501043 A | 4/2015 |

(Continued)

OTHER PUBLICATIONS

International Search Report issued in PCT/JP2016/002592 dated Sep. 20, 2016.

(Continued)

*Primary Examiner* — Nathanael R Briggs
(74) *Attorney, Agent, or Firm* — Edwards Neils, LLC; Jean C. Edwards, Esq.

(57) ABSTRACT

A wavelength conversion member is provided. The wavelength conversion member includes: a wavelength conversion layer including at least one kind of quantum dots that are excited by excitation light to emit fluorescence and an antioxidant; at least one interposing layer that is formed to be adjacent to the wavelength conversion layer; and a barrier layer that is formed on at least one surface of the wavelength conversion layer, in which at least one layer of the interposing layers is an antioxidant-containing interposing layer including the antioxidant.

15 Claims, 10 Drawing Sheets

(51) Int. Cl.
- *C09K 11/02* (2006.01)
- *C09K 11/88* (2006.01)
- *H01L 33/50* (2010.01)
- *G02F 1/1335* (2006.01)

(52) U.S. Cl.
CPC ....... *G02B 6/005* (2013.01); *G02F 1/133621* (2013.01); *H01L 33/50* (2013.01); *G02B 6/0055* (2013.01); *G02F 2001/133614* (2013.01); *G02F 2202/36* (2013.01)

(58) Field of Classification Search
CPC ... G02F 1/133621; G02F 2001/133614; G02F 2202/36; H01L 33/50
See application file for complete search history.

(56) References Cited

U.S. PATENT DOCUMENTS

| | | |
|---|---|---|
| 2012/0113672 A1 | 5/2012 | Dubrow et al. |
| 2013/0139868 A1 | 6/2013 | Zhang et al. |
| 2013/0313595 A1 | 11/2013 | Naasani et al. |
| 2014/0367633 A1 | 12/2014 | Bibl et al. |
| 2015/0041052 A1 | 2/2015 | Zhang et al. |
| 2015/0330602 A1 | 11/2015 | Yonemoto et al. |
| 2015/0331285 A1 | 11/2015 | Bibl et al. |
| 2016/0195229 A1* | 7/2016 | Tokinoya ................ B32B 27/36 362/612 |

FOREIGN PATENT DOCUMENTS

| | | |
|---|---|---|
| JP | 2006-160618 A | 6/2006 |
| JP | 2011-054814 A | 3/2011 |
| JP | 2013-123037 A | 6/2013 |
| JP | 2014-019771 A | 2/2014 |
| JP | 2015-513212 A | 4/2015 |
| JP | 2016-001302 A | 1/2016 |
| JP | 2016-021433 A | 2/2016 |
| JP | 2016-065178 A | 4/2016 |
| JP | 2016-081055 A | 5/2016 |
| JP | 2016-108548 A | 6/2016 |
| KR | 2013-0069240 A | 6/2013 |
| WO | 2011/031876 A1 | 3/2011 |
| WO | 2013/078252 A1 | 5/2013 |
| WO | 2014/204694 A1 | 12/2014 |
| WO | 2015/037733 A1 | 3/2015 |

OTHER PUBLICATIONS

Written Opinion issued in PCT/JP2016/002592 dated Sep. 20, 2016.
International Preliminary Report on Patentability completed by WIPO dated Dec. 14, 2017, in connection with International Patent Application No. PCT/JP2016/002592.
Office Action, issued by the Japanese Patent Office dated Oct. 2, 2018, in connection with Japanese Patent Application No. 2017-521687.
Office Action, issued by the Korean Intellectual Property Office (KIPO) dated Dec. 26, 2018, in connection with Korean Patent Application No. 10-2017-7033633.

* cited by examiner

WAVELENGTH CONVERSION MEMBER, BACKLIGHT UNIT INCLUDING WAVELENGTH CONVERSION MEMBER, AND LIQUID CRYSTAL DISPLAY DEVICE

CROSS-REFERENCE TO RELATED APPLICATIONS

This application is a continuation application of International Application No. PCT/JP2016/002592, filed May 27, 2016, which was published under PCT Article 21(2) in Japanese, the disclosure of which is incorporated herein by reference in its entirety. Further, this application claims priority from Japanese Patent Application No. 2015-110908, filed May 29, 2015, the disclosure of which is incorporated herein by reference in its entirety.

BACKGROUND OF THE INVENTION

1. Field of the Invention

The present invention relates to a wavelength conversion member, a backlight unit including the wavelength conversion member, and a liquid crystal display device, the wavelength conversion member including a wavelength conversion layer including quantum dots which emit fluorescence by irradiation with excitation light.

2. Description of the Related Art

A flat panel display such as a liquid crystal display device (LCD) has been more widely used as a space-saving image display device having low power consumption. A liquid crystal display device includes at least a backlight and a liquid crystal cell and typically further includes a member such as a backlight-side polarizing plate or a visible-side polarizing plate.

Recently, a configuration in which a wavelength conversion layer including quantum dots (QDs) as a light emitting material is provided in a wavelength conversion member of a backlight unit in order to improve color reproducibility of an LCD has attracted attention (refer to US2012/0113672A). The wavelength conversion member converts the wavelength of light incident from a light source so as to emit white light. In the wavelength conversion layer including the quantum dots as a light emitting material, white light can be realized using fluorescence which is emitted by excitation of two or three kinds of quantum dots having different light emitting properties caused by light incident from a light source.

The fluorescence emitted from the quantum dots has high brightness and a small full width at half maximum. Therefore, an LCD using quantum dots has excellent color reproducibility. Due to the progress of such a three-wavelength light source technique using quantum dots, the color reproduction range of an LCD has been widened from 72% to 100% in terms of current TV standards (Full High Density (FHD)) and National Television System Committee (NTSC) ratio.

It is known that permeation of oxygen is necessarily suppressed in a layer including quantum dots (hereinafter, referred to as "QD layer"). In a case where oxygen permeates into a QD layer, there is a problem in that the emission intensity decreases due to photooxidation caused by contact between quantum dots and oxygen.

In order to solve the problem, a configuration of a wavelength conversion member is disclosed in which a barrier film which suppresses permeation of oxygen is provided outside of a QD layer in order to protect the quantum dots from oxygen permeated from the outside of the wavelength conversion member (for example, US2012/0113672A).

Typically, for example, the following configurations of a barrier film are known: a configuration in which substrates having oxygen barrier properties are used as supports between which a QD layer is interposed such that the substrates themselves are used as barrier films; and a configuration in which an inorganic barrier layer or an organic barrier layer having oxygen barrier properties is provided on a surface of a support. As the inorganic barrier layer having oxygen barrier properties and water vapor barrier properties, an inorganic layer formed of an inorganic oxide, an inorganic nitride, an inorganic oxynitride, a metal, or the like is preferably used.

However, the configuration of the wavelength conversion member in which a barrier film is provided outside of the QD layer as described in US2012/0113672A can suppress the permeation of oxygen into the QD layer to some extent but is not sufficient. In particular, for example, in a case where a wavelength conversion member having a long film shape is formed and then cut to manufacture a wavelength conversion member having a desired size, a QD layer is exposed to external air from a cut side surface. Therefore, a countermeasure against permeation of oxygen from the cut side surface is also required.

WO2011/031876A and WO2013/078252A disclose a configuration in which a QD layer includes a light stabilizer. WO2011/031876A and WO2013/078252A describe that, since the light stabilizer is present in the QD layer, effects of oxygen permeated into a barrier film, effects of oxygen permeated from a side surface, and the like can be reduced. In addition, US2013/0313595A discloses a quantum dot-containing bead containing a reducing agent such as ascorbic acid, palmitic acid, or alpha tocopherol (vitamin E).

SUMMARY OF THE INVENTION

On the other hand, in a case where a quantum dot-containing polymerizable composition used for forming a QD layer contains large amounts of a light stabilizer and a reducing agent, the light stabilizer and the reducing agent adversely affect a curing reaction of a precursor layer formed of the QD-containing polymerizable composition and inhibit curing of the layer. Thus, there is a possibility that the QD layer and the QD bead may contain a large amount of a low-polymerization-degree component. It is preferable that the amount of the low-polymerization-degree component is small from the viewpoint of durability since the component causes aging deterioration in physical properties of a polymer.

The present invention has been made in consideration of the above-described circumstances, and an object thereof is to provide a wavelength conversion member having a wavelength conversion layer including quantum dots which emit fluorescence by irradiation with excitation light in which the content of a low-polymerization-degree component in the wavelength conversion layer is small, the emission intensity is not likely to decrease, and the durability is high.

Another object of the present invention is to provide a backlight unit and a liquid crystal display device in which the emission intensity is not likely to decrease, the durability is high, and the brightness is high.

According to the present invention, there is provided a wavelength conversion member comprising: a wavelength conversion layer including at least one kind of quantum dots that are excited by excitation light to emit fluorescence, and an antioxidant; at least one interposing layer that is formed to be adjacent to the wavelength conversion layer; and a barrier layer that is formed on at least one surface of the wavelength conversion layer, in which at least one layer of the interposing layers is an antioxidant-containing interposing layer including the antioxidant.

In a case where the wavelength conversion layer includes a low-polymerization-degree component having a polymerization degree of 2 or more and 4 or less, a content of the low-polymerization-degree component in the wavelength conversion layer is preferably 5 mass % or less.

The antioxidant is preferably at least one of a radical inhibitor, a metal deactivator, a singlet oxygen eliminator, a superoxide eliminator, or a hydroxy radical eliminator, more preferably at least one of a hindered phenol compound, a hindered amine compound, a quinone compound, a hydroquinone compound, a tocopherol compound, an aspartic acid compound, or a thiol compound, and still more preferably at least one of a citric acid compound, an ascorbic acid compound, or a tocopherol compound.

As a preferable aspect of the wavelength conversion member of the present invention, the antioxidant-containing interposing layer may be formed between the barrier layer and the wavelength conversion layer. As the antioxidant-containing interposing layer according to the aspect, a pressure sensitive adhesive layer formed between the barrier layer and the wavelength conversion layer may be used.

In addition, the wavelength conversion layer may include a first wavelength conversion layer including first quantum dots that emit fluorescence of a first wavelength, and a second wavelength conversion layer including second quantum dots that emit fluorescence of a second wavelength different from the first wavelength, and the antioxidant-containing interposing layer may be disposed to be adjacent to the first wavelength conversion layer and the second wavelength conversion layer.

The antioxidant-containing interposing layer is preferably formed to be adjacent to both surfaces of the wavelength conversion layer.

In addition, as another preferable aspect of the wavelength conversion member of the present invention, a region where the wavelength conversion layer and the antioxidant-containing interposing layer are present on the same plane may be at least partially provided, and in the region, the wavelength conversion layer may be partitioned by the interposing layer and scattered or the interposing layer may be partitioned by the wavelength conversion layer and scattered. Among these, a more preferable aspect is that an average width of dots of either of the wavelength conversion layer or the antioxidant-containing interposing layer, which is partitioned and scattered, is in a range of 0.05 to 1.0 mm, and a volume ratio Vw/(Vw+Vo) that is calculated by a volume Vw of the wavelength conversion layer and a volume Vo of the interposing layer in a solid region including at least the wavelength conversion layer is in a range of 0.2 to 0.8. As the antioxidant-containing interposing layer according to an arbitrary aspect, a support-shaped spacer structure that is formed between two barrier layers, or a partition structure in which a space is formed between two barrier layers may be used.

It is more preferable that the antioxidant-containing interposing layer is formed to be adjacent to both surfaces of the wavelength conversion layer and the two interposing layers are connected to each other.

It is preferable that the barrier layer includes silicon oxide, silicon nitride, silicon carbide, or aluminum oxide. It is preferable that an oxygen permeability of the barrier layer is $0.1 \text{ cm}^3/(\text{m}^2 \cdot \text{Day} \cdot \text{atm})$ or lower.

In the specification, the oxygen permeability refers to a value measured under conditions of measurement temperature: 23° C. and relative humidity: 90% RH, and an oxygen permeability of $0.1 \text{ cm}^3/(\text{m}^2 \cdot \text{day} \cdot \text{atm})$ or lower means that the oxygen permeability is $1.14 \times 10^{-2} \text{ fm}/(\text{s} \cdot \text{Pa})$ or lower in SI units.

It is preferable that the barrier layer is provided on both surfaces of the wavelength conversion layer.

According to the present invention, there is provided a backlight unit comprising: the wavelength conversion member according to the present invention; and a light source a light source that emits primary light to be incident on the wavelength conversion member.

According to the present invention, there is provided a liquid crystal display device comprising: the backlight unit according to the present invention; and a liquid crystal cell on which light emitted from the backlight unit is incident.

According to the present invention, there is provided a first method of manufacturing a wavelength conversion member which is a method of manufacturing the wavelength conversion member according to the present invention, the method comprising: preparing a substrate in which the antioxidant-containing interposing layer is provided on a surface thereof; disposing a precursor layer of the wavelength conversion layer which is formed of a polymerizable composition including at least one kind of quantum dots to be adjacent to the surface of the antioxidant-containing interposing layer; and curing the precursor layer.

According to the present invention, there is provided a second method of manufacturing a wavelength conversion member which is a method of manufacturing the wavelength conversion member according to the present invention, the method comprising: disposing a precursor layer of the wavelength conversion layer which is formed of a polymerizable composition including at least one kind of the quantum dots on a substrate; forming a cured layer by curing the precursor layer; and disposing the antioxidant-containing interposing layer to be adjacent to the cured layer.

According to the present invention, there is provided a third method of manufacturing a wavelength conversion member which is a method of manufacturing the wavelength conversion member according to the present invention, the method comprising: disposing a precursor layer of the wavelength conversion layer which is formed of a polymerizable composition including at least one kind of the quantum dots on a substrate in a pattern shape; forming a cured layer by curing the precursor layer; and disposing the antioxidant-containing interposing layer to fill a space between patterns of the wavelength conversion layer with the antioxidant-containing interposing layer.

According to the present invention, there is provided a fourth method of manufacturing a wavelength conversion member which is a method of manufacturing the wavelength conversion member according to the present invention, the method comprising: disposing the antioxidant-containing interposing layer on a substrate in a pattern shape; disposing a precursor layer of the wavelength conversion layer which is formed of a polymerizable composition including at least one kind of the quantum dots to fill a space between patterns of the antioxidant-containing interposing layer with the precursor layer; and then forming a cured layer by curing the precursor layer.

In the specification, the "half-width" of a peak indicates the width of a peak at a height of ½ of a peak height. In addition, light having a center emission wavelength in a wavelength range of 430 to 480 nm is referred to as blue light, light having a center emission wavelength in a wavelength range of 520 to 560 nm is referred to as green light, and light having a center emission wavelength in a wavelength range of 600 to 680 nm is referred to as red light.

In addition, the solid region including at least the wavelength conversion layer refers to a solid region partitioned by, in a case where the wavelength conversion layer and the antioxidant-containing interposing layer are mixed in a plane, a region from the lowermost end to the uppermost end of the wavelength conversion layer in a film thickness direction, and by a region between side edge portions of a region in which the wavelength conversion layer is present in an in-plane direction. Further, the "average width" of partitioned dots of the antioxidant-containing interposing layer and the wavelength conversion layer refers to an average value obtained by applying the maximum width for one partitioned dot to a plurality of dots. The number of dots used to obtain the average value may be a statistically reliable number.

The wavelength conversion member according to the present invention includes a wavelength conversion layer including at least one kind of quantum dots that are excited by excitation light to emit fluorescence and an antioxidant, at least one interposing layer that is formed to be adjacent to the wavelength conversion layer, and a barrier layer that is formed at least one surface of the wavelength conversion layer, in which at least one layer of the interposing layers is an antioxidant-containing interposing layer including the antioxidant. In the wavelength conversion member having the configuration, since the wavelength conversion layer contains an antioxidant, photooxidation of quantum dots caused by oxygen present in the wavelength conversion layer can be effectively prevented. In addition, in the wavelength conversion member having the configuration, since the interposing layer contains an antioxidant, photooxidation of quantum dots caused by oxygen permeated over time can be continuously prevented by the antioxidant released from the interposing layer to the wavelength conversion layer. Further, in the wavelength conversion member having the configuration, the content of the low-polymerization-degree component in the wavelength conversion layer is small and aging deterioration in the physical properties of the wavelength conversion layer due to the presence of the low-polymerization-degree component is less likely to occur. Therefore, according to the present invention, it is possible to provide a wavelength conversion member of which emission intensity is not likely to decrease and the durability is high.

DESCRIPTION OF THE PREFERRED EMBODIMENTS

Figure 1:
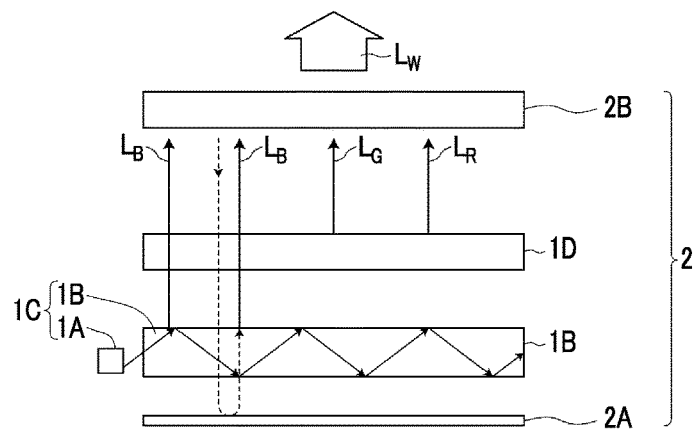
FIG. 1 is a cross-sectional view showing a schematic configuration of a backlight unit including a wavelength conversion member according to an embodiment of the present invention.
Figure 2:
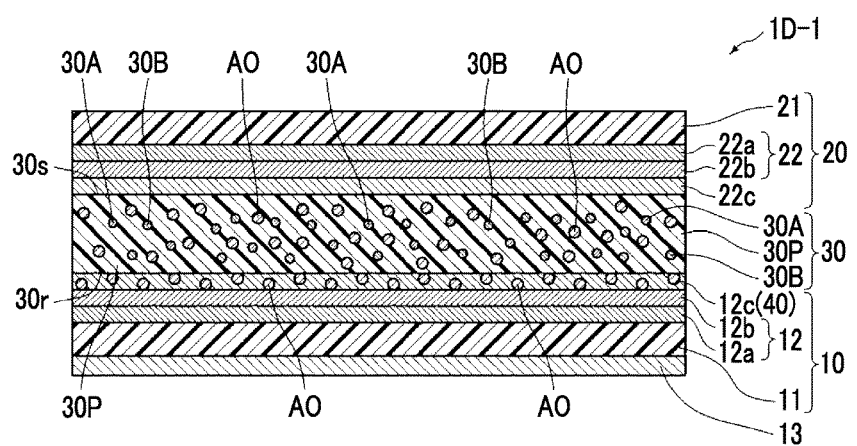
FIG. 2 is a cross-sectional view showing a schematic configuration of a wavelength conversion member according to a first embodiment of the present invention.

A wavelength conversion member according to an embodiment of the present invention and a backlight unit including the wavelength conversion member will be described with reference to the drawings. FIG. 1 is a cross-sectional view showing a schematic configuration of a backlight unit including a wavelength conversion member according to an embodiment. FIG. 2 is a cross-sectional view showing a schematic configuration of a first embodiment of the wavelength conversion member according to the present invention. FIGS. 3 to 10 are cross-sectional views showing schematic configurations of second to ninth embodiments of the wavelength conversion member according to of the present invention. In the drawings of this specification, dimensions of respective portions are appropriately changed in order to easily recognize the respective portions. In the specification, numerical ranges represented by "to" include numerical values before and after "to" as lower limit values and upper limit values.

As described above, a backlight unit 2 shown in FIG. 1 includes: a surface light source 1C including a light source 1A, which emits primary light (blue light $L_B$), and a light guide plate 1B which guides and emits the primary light emitted from the light source 1A, a wavelength conversion member 1D that is provided on the surface light source 1C, and a reflection plate 2A that is disposed to face the wavelength conversion member 1D with the surface light source 1C interposed therebetween. The wavelength conversion member 1D are excited by excitation light, which is at least a portion of the primary light $L_B$ emitted from the surface light source 1C, to emit fluorescence and emits secondary light ($L_G$, $L_R$) which includes the fluorescence and the primary light $L_B$ which has passed through the wavelength conversion member 1D.

The shape of the wavelength conversion member 1D is not particularly limited and may be an arbitrary shape such as a sheet shape or a bar shape.

In FIG. 1, excitation light ($L_B$) emitted from the wavelength conversion member absorbed by quantum dots 30A and 30B (not shown), the amount of fluorescence ($L_G$, $L_R$) required is emitted, and white light $L_W$ is realized and emitted.

In a case where ultraviolet light is used as the excitation light, by causing ultraviolet light as excitation light to be incident on the wavelength conversion member 1D including quantum dots 30A, 30B, and 30C (not shown), white light can be realized by green light emitted from the quantum dots 30A (not shown), red light emitted from the quantum dots 30B (not shown), and blue light emitted from the quantum dots 30C (not shown).

[Wavelength Conversion Member]

The wavelength conversion member 1D includes: a wavelength conversion layer 30 including the quantum dots 30A and 30B which are excited by the excitation light ($L_B$) to emit the fluorescence ($L_G$, $L_R$); and barrier layers 12 and 22 which are formed on surfaces of the wavelength conversion layer 30 (FIGS. 2 and 3 to 10).

In the first embodiment to the ninth embodiment shown in FIGS. 2 and 3 to 10, the wavelength conversion members 1D-1 to 1D-9 each include the wavelength conversion layer 30 and barrier films 10 and 20 provided on both main surfaces (surfaces) thereof, and the barrier films 10 and 20 respectively include supports 11 and 21 and the barrier layers 12 and 22 supported on surfaces of the supports 11 and 21.

FIGS. 2 and 3 to 10, the upper side (barrier film 20 side) of each of the wavelength conversion members 1D-1 to 1D-9 is an emission side in the backlight unit 2, and the lower side (barrier film 10 side) is a surface light source 1C side. The permeation of oxygen, which has permeated into the wavelength conversion members 1D-1 to 1D-9, into the wavelength conversion layer 30 on the emission side and the surface light source 1C side is suppressed by the barrier films 10 and 20.

As described above in "SUMMARY OF THE INVENTION", the configuration where the wavelength conversion layer including quantum dots in the wavelength conversion member contains a light stabilizer, a reducing agent, and the like can reduce photooxidation of quantum dots caused by oxygen which has passed through the barrier film or oxygen which has permeated from the side surface; however, in a case where large amounts of a light stabilizer and a reducing agent are included in the quantum dot-containing polymerizable composition which is a precursor of the wavelength conversion layer, there is a possibility of causing curing inhibition of the precursor layer of the wavelength conversion layer. The present inventors performed an investigation on a configuration that makes it possible to manufacture the wavelength conversion member by suppressing the amount of the low-polymerization-degree component present in the wavelength conversion layer and to reduce the effect of permeation of oxygen which has passed through the barrier film or oxygen which has permeated from the side surface.

That is, each of the wavelength conversion members 1D-1 to 1D-9 according to the embodiments of the present invention includes a wavelength conversion layer 30 including at least one kind of quantum dots (30A, 30B) which are excited by excitation light ($L_B$) to emit fluorescence ($L_G$, $L_R$) and an antioxidant AO, at least one interposing layer (12c, 22c, 50, 60) that is formed to be adjacent to the wavelength conversion layer 30, and a barrier layer (12, 22) that is formed on at least one surface of the wavelength conversion layer 30, and at least one layer of the interposing layers (12c, 22c, 50, 60) is an antioxidant-containing interposing layer 40 containing an antioxidant AO.

Figure 3:
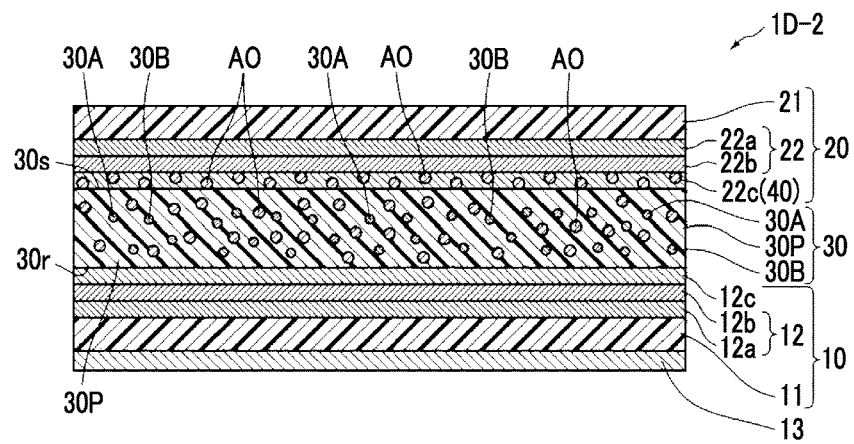
FIG. 3 is a cross-sectional view showing a schematic configuration of a wavelength conversion member according to a second embodiment of the present invention
Figure 4:
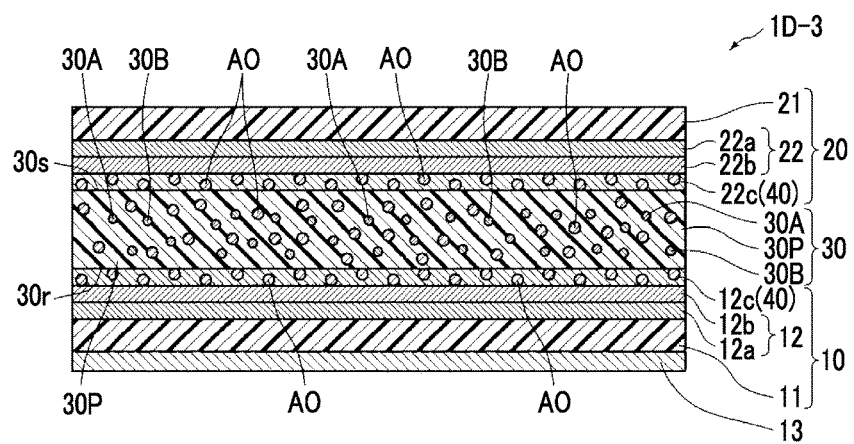
FIG. 4 is a cross-sectional view showing a schematic configuration of a wavelength conversion member according to a third embodiment of the present invention.

The wavelength conversion member 1D-1 according to the first embodiment shown in FIG. 2 is an embodiment in which a barrier overcoat layer 12c of the barrier layer 12 is the antioxidant-containing interposing layer 40, the wavelength conversion member 1D-2 of the second embodiment shown in FIG. 3 is an embodiment in which a barrier overcoat layer 22c of the barrier layer 22 is the antioxidant-containing interposing layer 40, and the wavelength conversion member 1D-3 of the third embodiment shown in FIG. 4 is an embodiment in which barrier overcoat layers 12c and 22c are the antioxidant-containing interposing layers 40.

Figure 5:
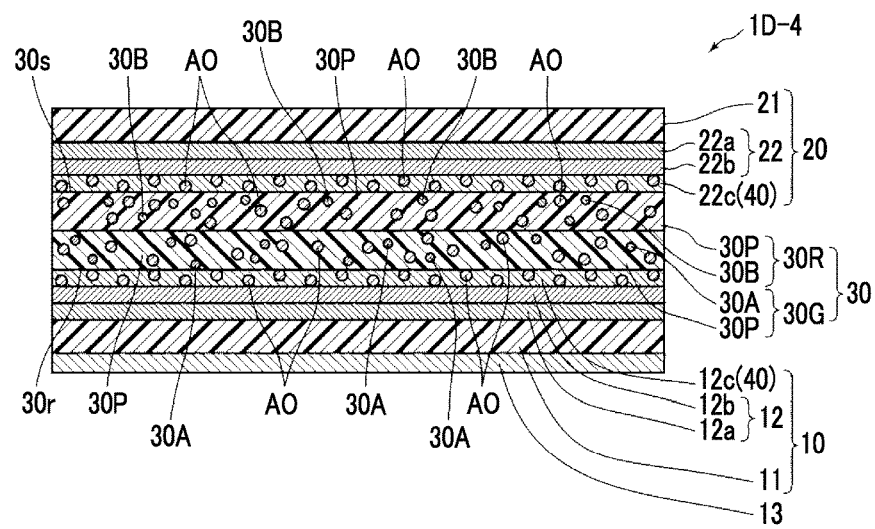
FIG. 5 is a cross-sectional view showing a schematic configuration of a wavelength conversion member according to a fourth embodiment of the present invention.
Figure 6:
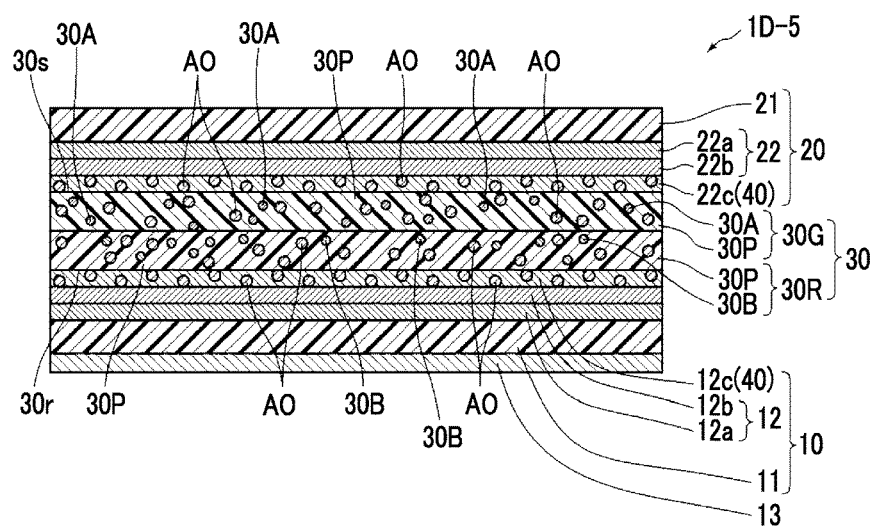
FIG. 6 is a cross-sectional view showing a schematic configuration of a wavelength conversion member according to a fifth embodiment of the present invention.

In addition, the wavelength conversion member 1D-4 according to the fourth embodiment shown in FIG. 5 and the wavelength conversion member 1D-5 according to the fifth embodiment shown in FIG. 6 are embodiments in which in the wavelength conversion member 1D-3 of the third embodiment, the wavelength conversion layer 30 is formed by two layers of a wavelength conversion layer 30G including quantum dots 30A which emit the fluorescence $L_G$ and a wavelength conversion layer 30R including quantum dots 30B which emit fluorescence $L_R$.

Figure 7:
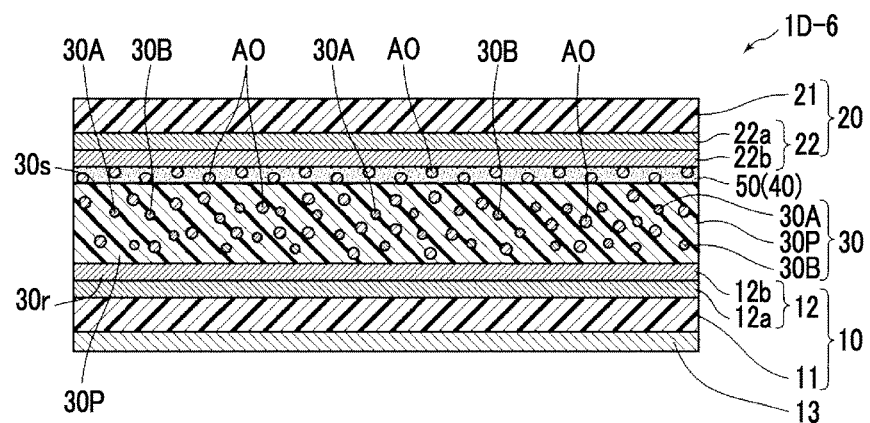
FIG. 7 is a cross-sectional view showing a schematic configuration of a wavelength conversion member according to a sixth embodiment of the present invention.

The wavelength conversion member 1D-6 according to the sixth embodiment shown in FIG. 7 is an embodiment in which an adhesive used for bonding the wavelength conversion layer 30 and the barrier film 20 contains the antioxidant AO, and a pressure sensitive adhesive layer 50 is the antioxidant-containing interposing layer 40.

Figure 8:
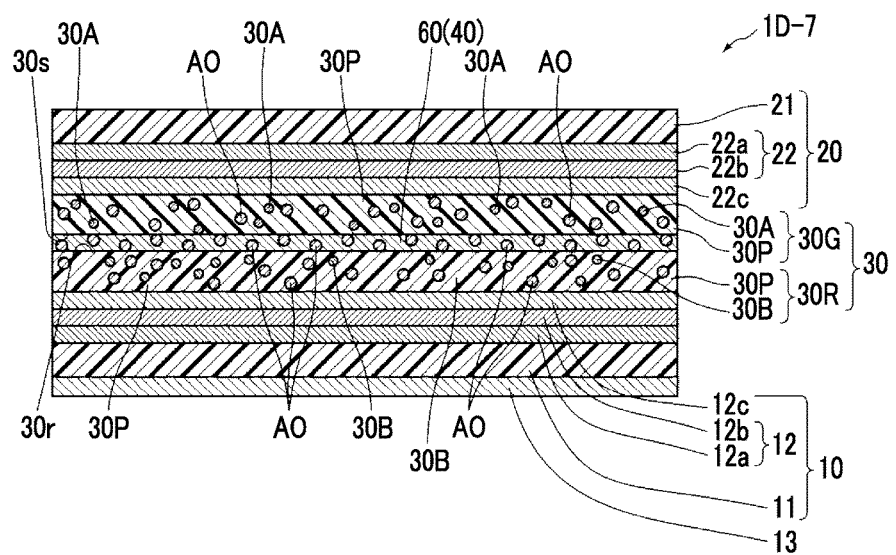
FIG. 8 is a cross-sectional view showing a schematic configuration of a wavelength conversion member according to a seventh embodiment of the present invention.
Figure 9:
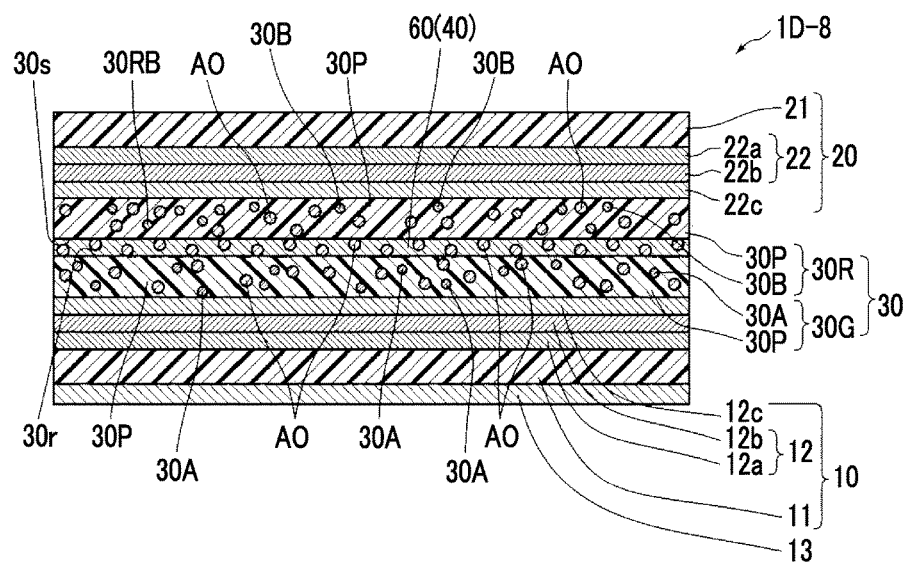
FIG. 9 is a cross-sectional view showing a schematic configuration of a wavelength conversion member according to an eighth embodiment of the present invention.

The wavelength conversion member 1D-7 according to the seventh embodiment shown in FIG. 8 and the wavelength conversion member 1D-8 according to the eighth embodiment shown in FIG. 9 are embodiments in which in each of the wavelength conversion member 1D-4 according to the fourth embodiment shown in FIG. 5 and the wavelength conversion member 1D-5 according to the fifth embodiment shown in FIG. 6, the barrier overcoat layer (12c, 22c) does not contain the antioxidant AO, and the antioxidant-containing interposing layer 40, as an interlayer 60, is provided between the wavelength conversion layer 30G including the quantum dots 30A which emit the fluorescence $L_G$ and the wavelength conversion layer 30R including the quantum dots 30B which emit the fluorescence $L_R$.

Figure 10:
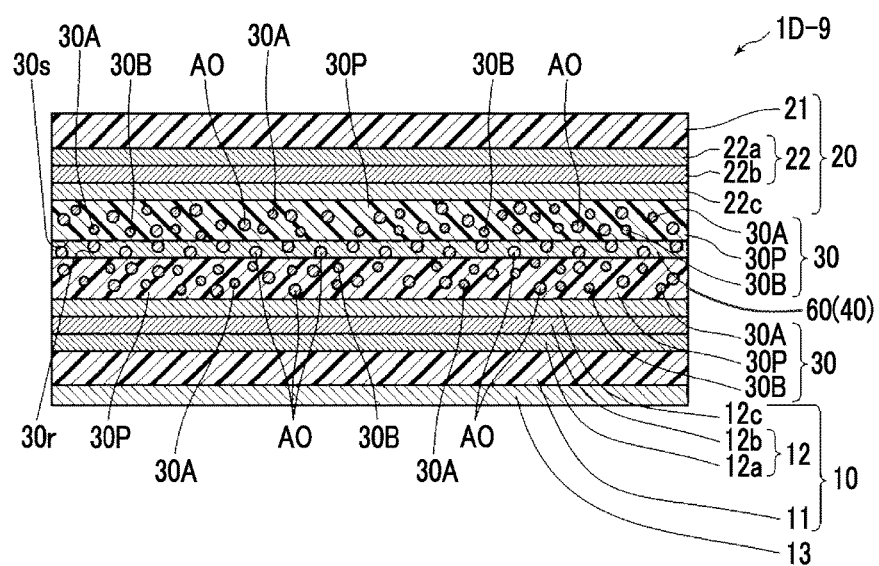
FIG. 10 is a cross-sectional view showing a schematic configuration of a wavelength conversion member according to a ninth embodiment of the present invention.

The wavelength conversion member 1D-9 according to the ninth embodiment shown in FIG. 10 is an embodiment in which in the wavelength conversion member 1D-1 according to the first embodiment shown in FIG. 2, the barrier overcoat layer 12c does not contain the antioxidant AO and the antioxidant-containing interposing layer 40 is provided in the wavelength conversion layer 30 as the interlayer 60.

The wavelength conversion members 1D-1 to 1D-9 according to the first to ninth embodiments described above can be manufactured by a first method of manufacturing a wavelength conversion member according to the present invention including: preparing a substrate in which the antioxidant-containing interposing layer 40 is provided on a surface; disposing a precursor layer of the wavelength conversion layer (30, 30G, 30R) which is formed of a polymerizable composition including at least one kind of quantum dots to be adjacent to the surface; and curing the precursor layer, a second manufacturing method including: disposing a precursor layer 30M of the wavelength conversion layer (30, 30G, 30R) which is formed of a polymerizable composition including at least one kind of quantum dots on a substrate; forming a cured layer by curing the precursor layer 30M; and disposing the antioxidant-containing interposing layer 40 to be adjacent to the cured layer, or combination of these methods. Here, the substrate may be the substrate itself or may be a laminated substrate obtained by laminating various functional layers on the substrate. The embodiment of the substrate is different according to each embodiment and thus the reference symbol is omitted.

As a representative configuration, the wavelength conversion member 1D-1 according to the first embodiment shown in FIG. 2 will be described. The wavelength conversion member 1D-1 includes a barrier film 10 including a barrier layer 12 formed by an organic barrier layer 12a and an inorganic barrier layer 12b on a support 11, and a barrier overcoat layer 12c (antioxidant-containing interposing layer 40) containing an antioxidant AO and covering the surface of the barrier layer 12, a wavelength conversion layer 30 that is formed to be adjacent to the barrier overcoat layer 12c (antioxidant-containing interposing layer 40) and includes at least one kind of quantum dots (30A, 30B) which are excited by excitation light ($L_B$) to emit fluorescence ($L_G$, $L_R$) and an antioxidant AO, and a barrier film 20 including a barrier layer 22 formed by an organic barrier layer 22a and an inorganic barrier layer 22b on a support 21 and a barrier overcoat layer 22c covering the surface of the barrier layer 22. In the wavelength conversion member 1D-1, the barrier film 10 includes an unevenness imparting layer (mat layer) 13 which imparts an uneven structure to a surface of the barrier film 10 opposite to the wavelength conversion layer 30 side. In the embodiment, the unevenness imparting layer 13 also functions as a light diffusion layer.

The wavelength conversion member 1D-1 can be manufactured by preparing the barrier film 10 as a substrate and disposing a precursor layer of the wavelength conversion layer 30 which is formed of a polymerizable composition including the quantum dots 30A which emit fluorescence $L_G$ and the quantum dots 30B which emit fluorescence $L_R$ be adjacent to the surface of the barrier overcoat layer 12c (antioxidant-containing interposing layer 40), and curing the precursor layer (first manufacturing method).

In the first manufacturing method, a method of disposing the precursor layer of the wavelength conversion layer 30 (refer to Examples described below) to be adjacent to the surface of the antioxidant-containing interposing layer 40 and curing the precursor layer is not particularly limited. As a preferable method, a method in which a precursor layer is formed by applying a polymerizable composition which becomes the raw material of the wavelength conversion layer 30 to the surface of the antioxidant-containing interposing layer 40 of the barrier film 10, the barrier film 20 is placed on the precursor layer such that the barrier overcoat layer 22c is adjacent to the precursor layer, and then the precursor layer is cured, a method in which the precursor layer 30M is formed by applying a polymerizable: composition which becomes the raw material of the wavelength conversion layer 30 to the surface of the antioxidant-containing interposing layer 40 of the barrier film 10, a cured layer is formed by curing the precursor layer 30M, and then the barrier film 20 is placed such that the barrier overcoat layer 22c is adjacent to the cured layer through a pressure sensitive adhesive layer (not shown), a method in which the precursor layer 30M is formed by applying a polymerizable composition which becomes the raw material of the wavelength conversion layer 30 to the barrier overcoat layer 22c of the barrier film 20, the barrier film 10 is placed on the precursor layer 30M such that the barrier overcoat layer 12c (antioxidant-containing interposing layer 40) is adjacent to the precursor layer, and then the precursor layer 30M is cured, and the like may be used.

In addition, the wavelength conversion member 1D-1 can be manufactured by preparing the barrier film 20 as a substrate, forming the precursor layer 30M by applying a polymerizable composition which becomes the raw material of the wavelength conversion layer 30 to the barrier overcoat layer 22c of the barrier film 20, forming a cured layer by curing the precursor layer 30M, and disposing the barrier overcoat layer 12c (antioxidant-containing interposing layer 40) to be adjacent to the cured layer (second manufacturing method).

In the second manufacturing method, a method of disposing the antioxidant-containing interposing layer 40 to be adjacent to the cured layer is not particularly limited. A method in which the barrier film 10 in which the antioxidant-containing interposing layer 40 is formed is disposed such that the barrier overcoat layer 12c (antioxidant-containing interposing layer 40) is adjacent to the cured layer through a pressure sensitive adhesive layer (not shown), a method in which the barrier film 20 in which the cured layer is formed is placed on the barrier film 10 in which the precursor layer 30M of the barrier overcoat layer 12c (antioxidant-containing interposing layer 40) is formed such that the cured layer and the precursor layer 30M of the barrier overcoat layer 12c are adjacent to each other and then the precursor layer 30M is cured, and the like may be used.

In the first manufacturing method, the antioxidant-containing interposing layer 40 and the precursor layer of the wavelength conversion layer (30, 30G, 30R) are disposed to be adjacent to each other and then the precursor layer 30M is cured. Then, the antioxidant AO contained in the antioxidant-containing interposing layer 40 diffuses into the cured layer and thus a wavelength conversion layer (30, 30G, 30R) including the antioxidant AO which has been included in the antioxidant-containing interposing layer 40 is formed. In the second manufacturing method, a layer obtained by disposing the antioxidant-containing interposing layer 40 to be adjacent to the cured layer of the precursor layer 30M also becomes a wavelength conversion layer (30, 30G, 30R) including the antioxidant AO which has been included in the antioxidant-containing interposing layer 40.

In the first manufacturing method and the second manufacturing method, in order to more effectively obtain the effect of preventing photooxidation of the quantum dots caused by the antioxidant AO in the wavelength conversion layer (30, 30G 30R), it is preferable that the time for allowing the antioxidant AO to sufficiently diffuse into the cured layer is made to elapse. The most suitable time for allowing the antioxidant AO to sufficiently diffuse into the cured layer varies depending on the kind of the matrix material of the wavelength conversion layer (30, 30G, 30R) and the antioxidant AO but it is preferable to set the elapsed time to 24 hours or longer at room temperate. In addition, in a case where the elapsed time is longer than 72 hours, it is considered that the diffusion of the antioxidant AO is rarely observed and the distribution of the antioxidant AO in the antioxidant-containing interposing layer 40 and the wavelength conversion layer (30, 30G 30R) has a substantially fixed shape.

In the first manufacturing method and the second manufacturing method, an uncured precursor layer 30M is cured in a state where the uncured precursor layer is interposed between the substrates (barrier films) for manufacturing, the wavelength conversion member is preferably manufactured as follows.

In the following description, a case where the uncured precursor layer 30M is cured in a state where the uncured precursor layer 30M of the wavelength conversion layer is interposed between the substrates 10 and 20 (hereinafter, referred to as the barrier films 10 and 20) provided with the barrier layers 12 and 22 on the supports 11 and 21 to manufacture the wavelength conversion member 1D-1 will be described as an example.

The manufacturing of the wavelength conversion member will be described with reference to FIGS. 11 and 12. However, the present invention is not limited to the following embodiment.

Figure 11:
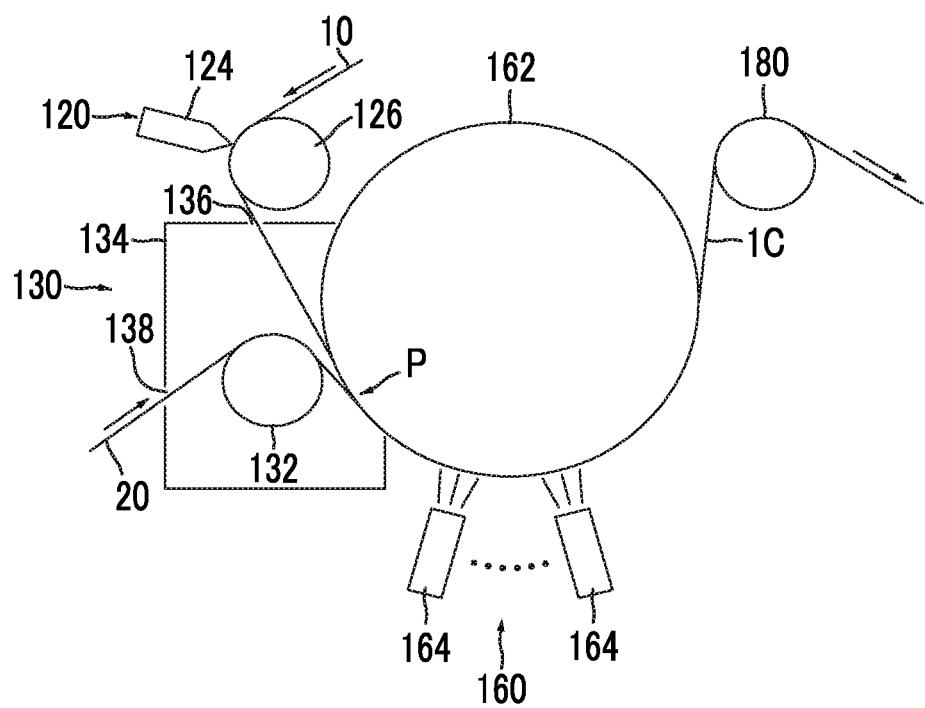
FIG. 11 is a diagram showing an example of a schematic configuration of a device of manufacturing a wavelength conversion member according to an embodiment of the present invention.
Figure 12:
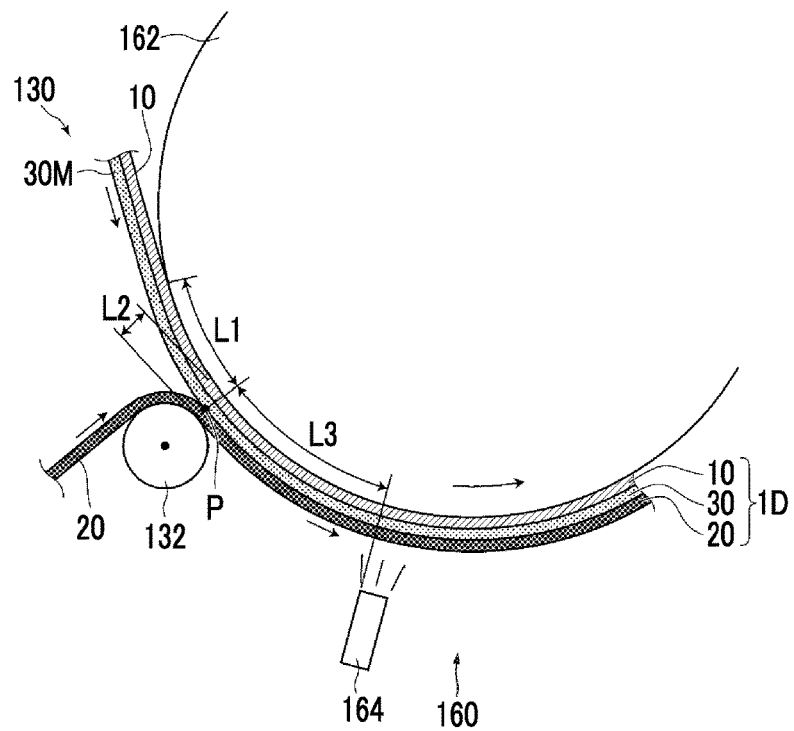
FIG. 12 is an enlarged view showing a part of the manufacturing device shown in FIG. 11.

FIG. 11 is a diagram showing an example of a schematic configuration of a device of manufacturing the wavelength conversion member 1D-1, and FIG. 12 is an enlarged view showing a part of the manufacturing device shown in FIG. 11. Steps of manufacturing the wavelength conversion member using the manufacturing device shown in FIGS. 11 and 12 include at least: a step of forming a coating film by applying the quantum dot-containing polymerizable composition to a surface of the first barrier film 10 (hereinafter, referred to as "first film") which is continuously transported; a step of interposing the coating film between the first film and the second film by laminating the second barrier film 20 (hereinafter, referred to as "second film"), which is continuously transported, on the coating film; and a step of forming the wavelength conversion layer (cured layer) by winding any one of the first film and the second film around a backup roller in a state where the coating film is interposed between the first film and the second film, and irradiating the coating film with light to be cured and polymerized while being continuously transported. In the embodiment, as the first film and the second film, the barrier films having barrier properties against oxygen and moisture are used. With the above-described configuration, the wavelength conversion member 1D-1 in which both surfaces of the wavelength conversion layer are protected by the barrier films can be obtained. A single surface of the wavelength conversion member may be protected by the barrier film. In this case, it is preferable that the barrier film side is a side close to the external air.

In the configuration in which the barrier overcoat layer 12c (antioxidant-containing interposing layer 40) is provided on the surface of the barrier layer 12 as in the first embodiment, a barrier film in which the barrier overcoat layer 12c (antioxidant-containing interposing layer 40) is provided on the surface of the barrier layer 12 is used as the second film.

More specifically, first, the first film 10 is continuously transported from a transporter (not shown) to a coating portion 120. The first film 10 is transported from the transporter at a transport speed of, for example, 1 to 50 m/min. In this case, the transport speed is not limited to the above value. During the transportation, for example, a tension of 20 to 150 N/m and preferably 30 to 100 N/m is applied to the first film 10.

In the coating portion 120, the quantum dot-containing polymerizable composition (hereinafter, also referred to as "coating solution") is applied to a surface of the first film 10, which is continuously transported, to form a precursor layer 30M (refer to FIG. 3) thereon. In the coating portion 120, for example, a die coater 124 and a backup roller 126 which is disposed to face the die coater 124 are provided. A surface of the first film 10 opposite to the surface on which the precursor layer 30M is formed is wound around the backup roller 126, and the coating solution is applied from a jetting port of the die coater 124 to the surface of the first film 10 which is continuously transported, to form the precursor layer 30M thereon. Here, the precursor layer 30M refers to the quantum dot-containing polymerizable composition which is applied to the first film 10 and is not cured.

In the embodiment, die coater 124 to which an extrusion coating method is applied is used as a coating device, but the present invention is not limited thereto. For example, coating devices to which various methods such as a curtain coating method, an extrusion coating method, a rod coating method, or a roll coating method are applied can be used.

The first film 10 which has passed through the coating portion 120 and on which the precursor layer 30M is formed is continuously transported to a laminating portion 130. In the laminating portion 130, the second film 20 which is continuously transported is laminated on the precursor layer 30M such that the precursor layer 30M is interposed between the first film 10 and the second film 20.

In the laminating portion 130, a laminating roller 132 and a heating chamber 134 which surrounds the laminating roller 132 are provided. In the heating chamber 134, an opening 136 through which the first film 10 passes and an opening 138 through which the second film 20 passes are provided.

At a position opposite to the laminating roller 132, a backup roller 162 is disposed. The first film 10 on which the precursor layer 30M is formed is continuously transported to a lamination position P in a state where a surface opposite to the surface on which the precursor layer 30M is formed is wound around the backup roller 162. The lamination position P refers to a position where contact between the second film 20 and the precursor layer 30M starts. It is preferable that the first film 10 is wound around the backup roller 162 before reaching the lamination position P. The reason for this is that, even in a case where wrinkles are formed in the first film 10, the wrinkles are corrected and removed by the backup roller 162 before reaching the lamination position P. Therefore, it is preferable that a distance L1 from a position (contact position) where the first film 10 is wound around the backup roller 162 to the lamination position P is long. For example, the distance L1 is preferably 30 mm or longer, and the upper limit value thereof is typically determined based on a diameter and a pass line of the backup roller 162.

In the embodiment, the second film 20 is laminated by the backup roller 162 which is used in a curing portion 160 and the laminating roller 132. That is, the backup roller 162 which is used in the curing portion 160 also functions as a roller used in the laminating portion 130. However, the present invention is not limited to this configuration. A laminating roller other than the backup roller 162 may be provided in the laminating portion 130 such that the backup roller 162 does not function as a roller used in the laminating portion 130.

By using the backup roller 162, which is used in the curing portion 160, in the laminating portion 130, the number of rollers can be reduced. In addition, the backup roller 162 can also be used as a heat roller for heating the first film 10.

The second film 20 transported from a transporter (not shown) is wound around the laminating roller 132 and is continuously transported between the laminating roller 132 and the backup roller 162. At the lamination position P, the second film 20 is laminated on the precursor layer 30M formed on the first film 10. As a result, the precursor layer 30M is interposed between the first film 10 and the second film 20. Laminating described herein represents that the second film 20 is laminated on the precursor layer 30M.

It is preferable that a distance L2 between the laminating roller 132 and the backup roller 162 is more than the total thickness of the first film 10, the cured layer obtained by curing and polymerizing the precursor layer 30M, and the second film 20. In addition, it is preferable that L2 is equal to or less than a length obtained by adding 5 mm to the total thickness of the first film 10, the precursor layer 30M, and the second film 20. By adjusting the distance L2 to be equal to or less than the length obtained by adding 5 mm to the total thickness, permeation of bubbles into a space between the second film 20 and the precursor layer 30M can be prevented. Here, the distance L2 between the laminating roller 132 and the backup roller 162 refers to the shortest distance between the outer circumferential surface of the laminating roller 132 and the outer circumferential surface of the backup roller 162.

Regarding the rotational accuracy of the laminating roller 132 and the backup roller 162, the radial run-out is 0.05 nm or less and preferably 0.01 nm or less. As the radial run-out decreases, the thickness distribution of the precursor layer 30M can be reduced.

In addition, in order to suppress thermal deformation after the precursor layer 30M is interposed between the first film 10 and the second film 20, a difference between the temperature of the backup roller 162 and the temperature of the first film 10 in the curing portion 160 and a difference between the temperature of the backup roller 162 and the temperature of the second film 20 are preferably 30° C. or lower, more preferably 15° C. or lower, and most preferably 0° C.

In a case where the heating chamber 134 is provided in order to reduce the differences from the temperature of the backup roller 162, it is preferable that the first film 10 and the second film 20 are heated in the heating chamber 134. For example, hot air is supplied from a hot air blower (not shown) into the heating chamber 134 such that the first film 10 and the second film 20 can be heated.

The first film 10 may be wound around the backup roller 162 whose temperature is controlled such that the first film 10 is heated by the backup roller 162.

On the other hand, regarding the second film 20, by using a heat roller as the laminating roller 132, the second film 20 can be heated by the laminating roller 132. In this case, the heating chamber 134 and the heat roller are not essential and can be optionally provided.

Next, the precursor layer 30M is continuously transported to the curing portion 160 while being interposed between the first film 10 and the second film 20. In the configuration shown in the drawing, curing in the curing portion 160 is performed by light irradiation. However, in a case where the polymerizable compound included in the quantum dot-containing polymerizable composition is polymerizable by heating, curing can be performed by heating such as blowing of warm air.

At the backup roller 162 and at a position opposite to the backup roller 162, a light irradiating device 164 is provided. The first film 10 and the second film 20 between which the precursor layer 30M is interposed are continuously transported between the backup roller 162 and the light irradiating device 164. Light irradiated by the light irradiating device may be determined depending on the kind of the photopolymerizable compound in the quantum dot-containing polymerizable composition. For example, ultraviolet light is used. Here, the ultraviolet light refers to light in a wavelength range of 280 to 400 nm. As a light source which emits ultraviolet light, for example, a low-pressure mercury lamp, a middle-pressure mercury lamp, a high-pressure mercury lamp, an ultrahigh-pressure mercury lamp, a carbon arc lamp, a metal halide lamp, or a xenon lamp can be used. The irradiation dose may be determined in a range where the polymerization and curing reaction can be performed. For example, the precursor layer 30M is irradiated with ultraviolet light in an irradiation dose of 100 to 10000 $mJ/cm^2$.

In the curing portion 160, the first film 10 is wound around the backup roller 162 in a state where the precursor layer 30M is interposed between the first film 10 and the second film 20, and the precursor layer 30M is irradiated with light by the light irradiating device 164 while being continuously transported. As a result, the precursor layer 30M is cured to form the cured layer (wavelength conversion layer) 30.

In the embodiment, the first film 10 side is wound around the backup roller 162 and is continuously transported. However, the second film 20 may be wound around the backup roller 162 and may be continuously transported.

"Being around the backup roller 162" represents a state where any one of the first film 10 and the second film 20 is in contact with a surface of the backup roller 162 at a given lap angle. Accordingly, the first film 10 and the second film 20 move in synchronization with the rotation of the backup roller 162 while being continuously transported. Any one of the first film 10 and the second 20 only has to be wound around the backup roller 162 while at least being irradiated with ultraviolet light.

The backup roller 162 includes a main body having a cylindrical shape and a rotating shaft that is disposed at both end portions of the main body. The main body of the backup roller 162 has a diameter $\phi$ of, for example, 200 to 1000 mm. The diameter $\phi$ of the backup roller 162 is not particularly limited. The diameter $\phi$ is preferably 300 to 500 mm from the viewpoints of curling deformation of the laminated film, facility costs, and rotational accuracy. By mounting a temperature controller on the main body of the backup roller 162, the temperature of the backup roller 162 can be controlled.

The temperature of the backup roller 162 can be determined in consideration of heat generation during the light irradiation, the curing efficiency of the precursor layer 30M, and the wrinkling of the first film 10 and the second film 20 on the backup roller 162. The temperature of the backup roller 162 is set to be in a temperature range of preferably 10° C. to 95° C. and more preferably 15° C. to 85° C. Here, the temperature regarding a roller refers to the surface temperature of the roller.

A distance L3 between the lamination position P and the light irradiating device 164 can be made to be, for example, 30 mm or more.

The precursor layer 30M is irradiated with light to form the cured layer 30 (wavelength conversion layer 30), and the wavelength conversion member 1D-1 including the first film 10, the cured layer 30, and the second film 20 is manufactured. The wavelength conversion member 1D-1 is peeled off from the backup roller 162 by a peeling roller 180. The wavelength conversion member 1D-1 is continuously transported to a winder (not shown) and then is wound in a roll shape by the winder.

The wavelength conversion members according to the second embodiment to the ninth embodiment can be manufactured by the above-described first manufacturing method, second manufacturing method, and a combination of these methods.

As described above, since in the wavelength conversion members 1D-1 to 1D-9, the wavelength conversion layer 30 contains the antioxidant AO, photooxidation of the quantum dots 30A and 30B caused by oxygen present in the wavelength conversion layer 30 can be more effectively prevented. In addition, since the interposing layer contains the antioxidant AO, the antioxidant AO released from the antioxidant-containing interposing layer 40 to the wavelength conversion layer 30 can continuously prevent photooxidation of the quantum dots 30A and 30B caused by oxygen permeated over time. Further, since the amount of the low-polymerization-degree component present in the wavelength conversion layer 30 can be suppressed, the content of the low-polymerization-degree component having a polymerization degree of 2 to 4 in wavelength conversion layer 30 is reduced and aging deterioration in the physical properties of the wavelength conversion layer due to the presence of the low-polymerization-degree component is reduced (refer to examples described below).

Accordingly, the wavelength conversion member 1D-1 to 1D-9 according to the embodiments are wavelength conversion member in which the emission intensity is not likely to decrease, and the durability is high.

Hereinafter, each component of the wavelength conversion member 1D will be described. In each embodiment, the barrier layers 12 and 22 are formed on the supports 11 and 21. However, the present invention is not particularly limited to the above-described embodiment and an embodiment in which a barrier layer is not formed on a support or the like may be used.

Figure 14:
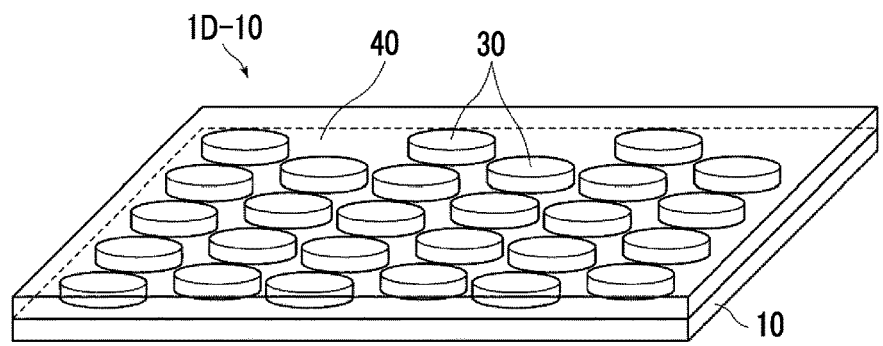
FIG. 14 is a perspective view showing a schematic configuration of a wavelength conversion member 1D-10 according to a tenth embodiment.
Figure 15:
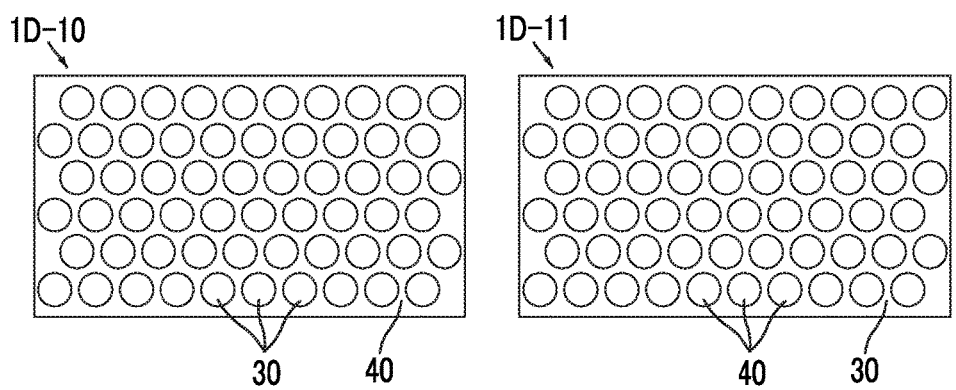
FIG. 15 shows plane views showing schematic configurations of the wavelength conversion member 1D-10 according to the tenth embodiment and a wavelength conversion member 1D-11 according to an eleventh embodiment.
Figure 16:
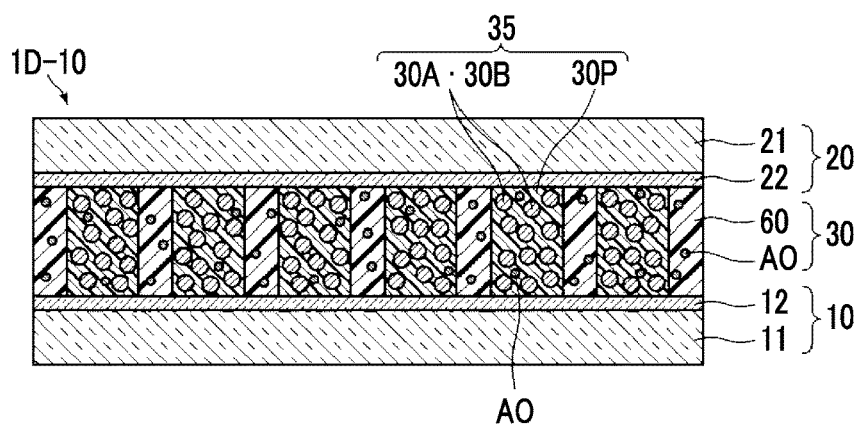
FIG. 16 is a cross-sectional view showing an example of a detailed schematic configuration of the wavelength conversion member according to the tenth embodiment.

In addition, FIG. 14 is a perspective view showing a schematic configuration of a wavelength conversion member 1D-10 according to a tenth embodiment (in which an upper barrier layer is omitted), and FIG. 15 shows plane views showing schematic configurations of the wavelength conversion member 1D-10 according to the tenth embodiment and the wavelength conversion member 1D-11 according to an eleventh embodiment. FIG. 16 is a cross-sectional view showing an example of a detailed schematic configuration of the wavelength conversion member 1D-10 according to the tenth embodiment. In the wavelength conversion member 1D-10 according to the tenth embodiment, the wavelength conversion layer 30 and the antioxidant-containing interposing layer 40 are on the same plane and the wavelength conversion layers 30 are discretely disposed in a dot pattern. In this configuration, in a case where a material having a lower oxygen permeability or a lower water vapor transmission rate than the wavelength conversion layer 30 is used for the antioxidant-containing interposing layer 40, this layer functions as a partition wall and the effect of further suppressing deterioration caused by oxygen or water vapor permeated from the side surface of the wavelength conversion member 30 can be expected. Thus, this case is preferable. In FIG. 16, the cross-sectional shape of the interlayer 60 which is the antioxidant-containing interposing layer 40 is drawn to have an equal \width in a thickness direction. However, the width in the thickness direction may change according to the embodiment to be adopted.

Figure 17:
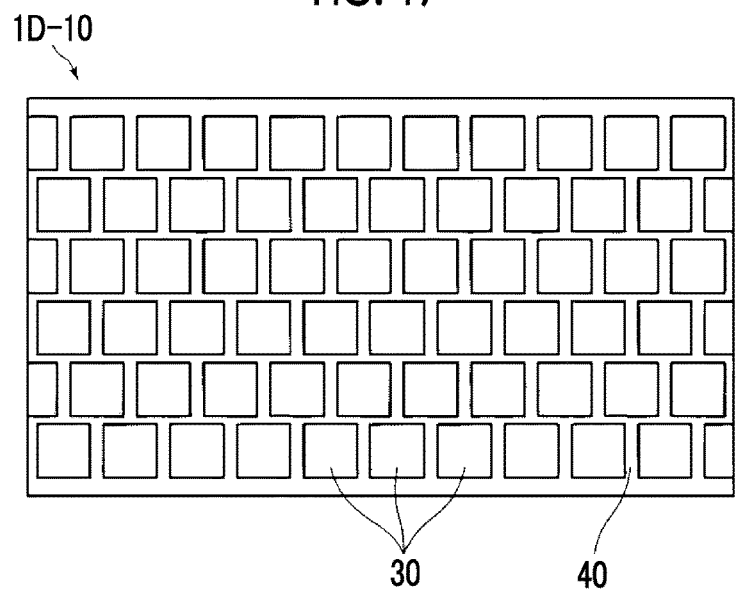
FIG. 17 is a plane view showing an example of a dot pattern in plane view.
Figure 18:
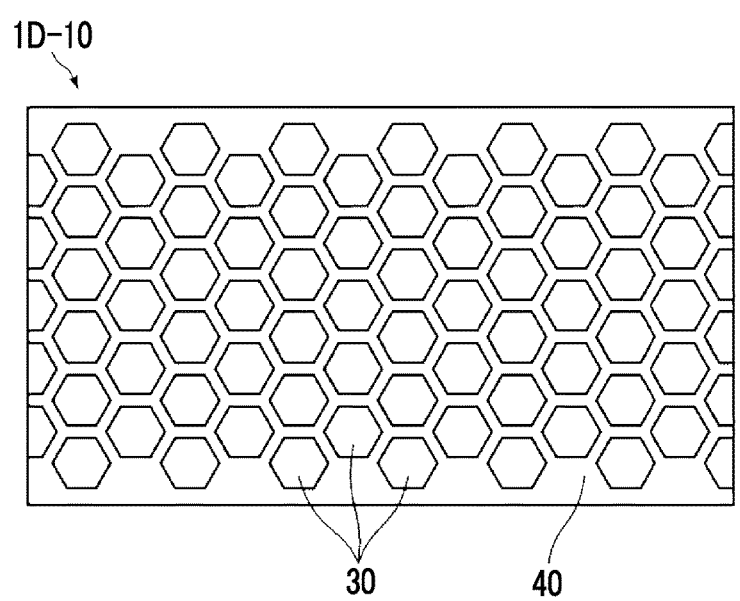
FIG. 18 is a plane view showing another example of a dot pattern in plane view.
Figure 19:
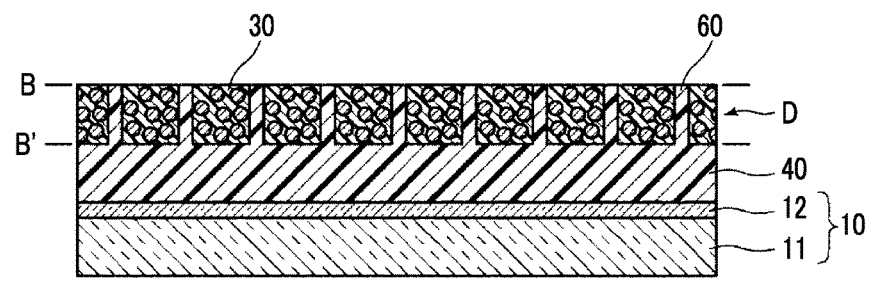
FIG. 19 is a cross-sectional view showing an example of uneven distribution of dots.
Figure 20:
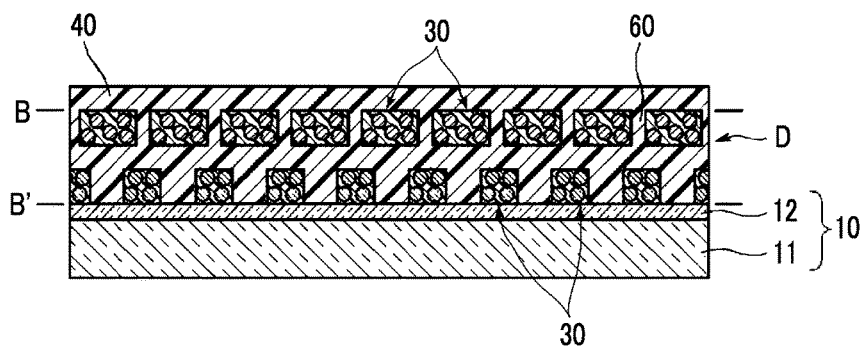
FIG. 20 is a cross-sectional view showing another example of uneven distribution of dots.

In FIG. 14, the wavelength conversion layer 30 has a cylindrical dot shape. However, the shape of the dot may be a square shape as shown in FIG. 17 or may be a polygonal shape as shown in FIG. 18. In addition, FIGS. 14, 17, and 18 are drawings in which the interposing layer is regularly and densely filled with the dots. However, according to the scope of the present invention, the dots are not necessarily regularly arranged and not necessarily densely arranged. In addition, as shown in FIG. 19 (in which the upper barrier layer and the antioxidant AO are omitted), the thickness of the antioxidant-containing interposing layer 40 may be uneven or the wavelength conversion layers 30 may be discretely present in the antioxidant-containing interposing layer 40 such that the thicknesses of the wavelength conversion layers are changed in the thickness direction. In such an embodiment, the thickness of a solid region where the wavelength conversion layer 30 and the antioxidant-containing interposing layer 40 are mixed can be set to, for example, a portion D defined as from the line B to the line B' in FIGS. 19 and 20. In FIGS. 19 and 20, the antioxidant-containing interposing layer 40 and the interlayer 60 may be continuously provided or may be separately provided to form an interface.

In addition, as the eleventh embodiment, in each drawing showing the tenth embodiment, for example, as compared to FIG. 15, an embodiment in which the antioxidant-containing interposing layer 40 is used instead of the wavelength conversion layer 30, the wavelength conversion layer 30 is used instead of the antioxidant-containing interposing layer 40, the antioxidant-containing interposing layers 40 are discretely disposed in a dot pattern, and the space between the interposing layers is filled with the wavelength conversion layer 30 can be adopted.

A volume ratio Vw/(Vw+Vo) that is calculated by a volume Vw of the wavelength conversion layer 30 in the solid region including at least the wavelength conversion layer 30 and a volume Vo of the antioxidant-containing interposing layer 40 is preferably in a range of 0.2 to 0.8. Within this range, a contact area between the layers is increased, the diffusion of the antioxidant from the antioxidant-containing interposing layer 40 to the wavelength conversion layer 30 is more effectively carried out, and thus the durability is improved. Also, the excitation light emitted from the light source can be sufficiently converted by the wavelength conversion layer and thus high brightness can be obtained.

The average width of the dots is preferably in a range of 0.01 mm to 1.0 mm and more preferably in a range of 0.02 mm to 5 mm. Within this range, a wavelength conversion member in which a movement distance required for moving the antioxidant to the wavelength conversion layer to exhibit the function is short, the effect of suppressing a decrease in brightness is excellent, and in-plane unevenness is small can be realized.

The wavelength conversion member according to the tenth embodiment can be obtained by preparing a precursor composition of the wavelength conversion layer which is formed of a polymerizable composition containing at least one kind of quantum dots, and a precursor composition of the antioxidant-containing interposing layer, disposing a precursor layer of the wavelength conversion layer which is formed of a polymerizable composition containing at least one kind of quantum dots on the substrate in a pattern shape by a printing method, a transfer method, an ink jet method, and the like and then forming a cured layer by curing the precursor layer, then filling a space between the patterns of the wavelength conversion layer with the precursor composition of the antioxidant-containing interposing layer by using a known method such as a coating method, an ink jet method, or a screening method and if necessary, hardening a film. Before a film of the precursor composition of the antioxidant-containing interposing layer is hardened, a film hardening treatment is performed after the upper surface of another substrate is covered. In a case of an antioxidant-containing interposing layer having adhesiveness, the film hardening treatment can function as a sealing step.

In the above-described method, the wavelength conversion member according to the tenth embodiment may be obtained by forming the precursor of the antioxidant-containing interposing layer into a pattern shape and filling the space between the patterns with the precursor composition of the wavelength conversion layer. In addition, by repeatedly performing these manufacturing methods on the wavelength conversion layer formed in advance or the like, a structure of a wavelength conversion layer and an antioxidant-containing interposing layer having a three-dimensionally laminated a pattern (for example, in FIG. 20, the upper barrier layer and the antioxidant AO are omitted) can be manufactured.

The dot disposing pattern used in these manufacturing methods may be a geometric pattern such as a lattice pattern or a halftone dot pattern or may be a pattern in which an artificial pattern including a random pattern is repeatedly disposed.

"Antioxidant-Containing Interposing Layer"

First, the antioxidant-containing interposing layer 40 will be described. The antioxidant-containing interposing layer 40 is the barrier overcoat layer 12c and/or 22c, the pressure sensitive adhesive layer 50, the interlayer 60 formed in the wavelength conversion layer 30 or the like as shown in the first to ninth embodiments. The antioxidant-containing interposing layer is not particularly limited as long as the layer is formed to be adjacent to the wavelength conversion layer (30, 30R, 30G).

As the antioxidant AO, as described in "theory and practice of antioxidant (San Shobo)", a radical inhibitor which suppresses a chain reaction of autoxidation, a peroxide decomposing agent which inactivates peroxide through non-radical decomposition, a metal deactivator which suppresses the oxidation accelerating action of metal, a synergist which increases the action of a radical inhibitor under co-presence with the radical inhibitor, a singlet oxygen eliminator which inactivates active oxygen, a superoxide eliminator, and a hydroxy radical eliminator may be used. The antioxidant of any mechanism can suppress photooxidation of the quantum dots caused by oxygen penetrated into the wavelength conversion layer 30 by allowing the antioxidant to be present in the wavelength conversion layer 30.

As described above, in the wavelength conversion member according to the embodiment, the antioxidant-containing interposing layer 40 including the antioxidant AO is provided as a layer adjacent to the wavelength conversion layer 30, and the antioxidant AO is incorporated in the wavelength conversion layer 30 by the diffusion of the antioxidant from the interposing layer over time. However, the antioxidant AO also remains in the antioxidant-containing interposing layer 40 after the diffusion of the antioxidant from the layer over time. By incorporating the antioxidant AO in the antioxidant-containing interposing layer 40, permeation of the oxygen passed through the barrier layer (12 and/or 22) into the wavelength conversion layer 30 can be reduced.

In addition, the antioxidant AO present in the antioxidant-containing interposing layer 40 and the wavelength conversion layer 30 also functions as a scatterer. Thus, the effect of increasing the wavelength conversion efficiency is exhibited and the effect of improving the emission brightness is also exhibited.

Further, in a case where fine particles formed of an inorganic material are used as the antioxidant AO, the antioxidant functions as an inorganic filler (for example, an effect of improving shape stability, an effect of improving mechanical strength, or an effect of improving heat resistance) in the layer containing the antioxidant AO. Thus, according to the wavelength conversion member 1D of the embodiment, the effect of improving dimensional stability obtained by an inorganic filler can be exhibited.

In the antioxidant-containing interposing layer 40, the configuration other than the antioxidant AO is variously changed according to the functions in a case of the barrier overcoat layer (12c, 22c), in a case of the pressure sensitive adhesive layer 50, in a case of the interlayer 60 formed in the wavelength conversion layer 30, and the like. Each functional layer will be described later.

(Antioxidant)

The content of the antioxidant AO in the antioxidant-containing interposing layer 40 is preferably 0.2 mass % or more, more preferably 1 mass % or more, and still more preferably 2 mass % or more with respect to the total mass of the antioxidant-containing interposing layer 40. On the other hand, the antioxidant may be changed by the interaction with oxygen. The changed antioxidant induces decomposition of the quantum dot-containing polymerizable composition in some cases and causes deterioration in adhesiveness, brittleness, and quantum dot emission effect. From the viewpoint of preventing these problems, the content of the antioxidant is preferably 20 mass % or less, more preferably 15 mass % or less, and still more preferably 10 mass % or less.

The antioxidant AO is preferably at least one of a radical inhibitor, a metal deactivator, a singlet oxygen eliminator, a superoxide eliminator, or a hydroxy radical eliminator. Examples of the antioxidant include a phenol-based antioxidant, a hindered amine-based antioxidant, a quinone-based antioxidant, a phosphorus-based antioxidant, and a thiol-based antioxidant.

Examples of the phenol-based antioxidant include 2,6-di-cert-butyl-p-cresol, 2,6-diphenyl-4-octadesiloxyphenol, distearyl (3,5-di-Cert-butyl-4-hydroxybenzyl)phosphonate, 1,6-hexamethylenebis[(3,5-di-tert-butyl-4-hydroxylphenyl) propionic acid amide], 4,4'-thiobis(6-tert-butyl-m-cresol), 2,2'-methylenebis(4-methyl-6-tert-butylphenol), 2,2'-methylenebis(4-ethyl-6-tert-butylphenol), 4,4'-butylidenebis(6-cert-butyl-m-cresol), 2,2'-ethylidenebis(4,6-di-tert-butylphenol), 2,2'-ethylidenebis(4-sec-butyl-6-tert-butylphenol), 1,1,3-tris(2-methyl-4-hydroxy-5-tert-butylphenyl)butane, 1,3,5-tris(2,6-dimethyl-3-hydroxy-4-tert-butylbenzyl)isocyanurate, 1,3,5-tris(3,5-di-tert-butyl-4-hydroxybenzyl)isocyanurate, 1,3,5-tris(3,5-di-tert-butyl-4-hydroxybenzyl)-2,4,6-trimethylbenzene, 2-tert-butyl-4-methyl-6-(2-acryloyloxy-3-tert-butyl-5-methylbenzyl)phenol, stearyl (3,5-di-tert-butyl-4-hydroxyphenyl)propionate, tetrakis[3-(3,5-di-tert-butyl-4-hydroxyphenyl)propionyloxymethyl]methane (ADEKA STAB AO-60 manufactured by Adeka Corporation), thiodiethylene glycol bis[(3,5-di-tert-butyl-4-hydroxyphenyl)propionate], 1,6-hexamethylenebis[(3,5-di-tert-butyl-4-hydroxyphenyl)propionate], bis[3,3-bis(4-hydroxy-3-tert-butylphenyl)butyric acid]glycol ester, bis[2-tert-butyl-4-methyl-6-(2-hydroxy-3-tert-butyl-5-methylbenzyl)phenyl]terephthalate, 1,3,5-tris[(3,5-di-tert-butyl-4-hydroxyphenyl)propionyloxyethyl]isocyanurate, 3,9-bis[1,1-dimethyl-2-{(3-tert-butyl-4-hydroxy-5-methylphenyl)propionyloxy}ethyl]-2,4,8,10-tetraoxaspiro[5.5]undecane, and triethyiene glycol bis[(3-tert-butyl-4-hydroxy-5-methylphenyl)propionate].

Examples of the phosphorus-based antioxidant include trisnonylphenyl phosphite, tris[2-tert-butyl-4-(3-tert-butyl-4-hydroxy-5-methylphenylthio)-5-methylphenyl]phosphite, tridecyl phosphite, octyldiphenyl phosphite, di(decyl)monophenyl phosphite, di(tridecyl)pentaerythritol diphosphite, di(nonylphenyl)pentaerythritol diphosphite, bis(2,4-di-tert-butylphenyl)pentaerythritol diphosphite, bis(2,6-di-tert-butyl-4-methylphenyl)pentaerythritol diphosphite, bis(2,4,6-tri-tert-butylphenyl)pentaerythritol diphosphite, bis(2,4-dicumylphenyl)pentaerythritol diphosphite, tetra(tridecy)isopropylidenediphenol diphosphite, tetra(tridecyl)-4,4'-n-butylidenebis(2-tert-butyl-5-methylphenol)diphosphite, hexa(tridecyl)-1,1,3-tris(2-methyl-4-hydroxy-5-tert-butylphenyl)butane triphosphite, tetrakis(2,4-di-tert-butylphenyl) biphenylene diphosphonite, 9,10-dihydro-9-oxa-10-phosphaphenanthrene-10-oxide, 2,2'-methylenebis(4,6-tert-butylphenyl)-2-ethylhexyl phosphite, 2,2'-methylenebis(4,6-tert-butylphenyl)-octadecyl phosphite, 2,2'-ethylidenebis(4,6-di-tert-butylphenyl)fluorophosphite, tris(2-[(2,4,8,10-tetrakis-tert-butyldibenzo[d,f][1,3,2]dioxaphosphepin-6-yl)oxy]ethyl)amine, and phosphites of 2-ethyl-2-butylpropylene glycol and 2,4,6-tri-tert-butylphenol. The amount of these phosphorus-based antioxidant added is preferably 0.001 to 10 parts by mass and particular y preferably 0.05 to 5 parts by mass with respect to 100 parts by mass of the polyolefin resin.

Examples of the thiol-based antioxidant include dialkyl thiodipropionates such as dilaurvl thiodipropionate, dimyristyl thiodipropionate, and distearyl thiodipropionate; and pentaerythritol tetra(β-alkyl mercapto propionate) esters.

The hindered amine-based antioxidants are also referred to as hindered amine light stabilizers (HALS) and has a structure in which all the hydrogen atoms on the carbon atoms at 2-position and 6-position of piperidine are substituted with methyl groups and preferably has a group represented by Formula 1. In this case, in Formula 1, X represents a hydrogen atom or an alkyl group. Among the groups represented by Formula 1, HALS having a 2,2,6,6-tetramethyl-4-piperidyl group in which X is a hydrogen atom, or a 1,2,2,6,6-pentamethyl-4-piperidyl group in which X is methyl are particularly preferably adopted. A structure in which the group represented by formula 1 is bonded to a —COO— group, that is, many HALS having a group represented by Formula 2 are commercially available in the market. These commercially available products can be preferably used.

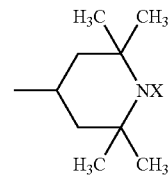

(Formula 1)

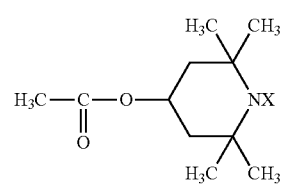

(Formula 2)

Specifically, examples of HALS that can be preferably used in the present invention include compounds represented by the following formula. Here, a 2,2,6,6-tetramethyl-4-piperidyl group is represented by R and a 1,2,2,6,6-pentamethyl-4-piperidyl group is represented by R'.

Compounds represented by ROC(=O)(CH$_2$)$_8$C(=O)OR, ROC(=O)C(CH$_3$)=CH$_2$, R'OC(=O)C(CH$_3$)=CH$_2$, CH$_2$(COOR)CH(COOR)CH(COOR)CH$_2$COOR, CH$_2$(COOR')CH(COOR')CH(COOR')CH$_2$COOR', and Formula 3, and the like.

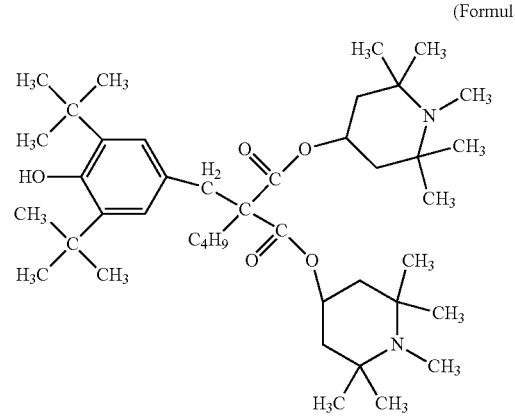

(Formula 3)

Specific examples thereof include hindered amine compounds such as 2,2,6,6-tetramethyl-4-piperidyl stearate, 1,2,2,6,6-pentamethyl-4-piperidyl stearate, 2,2,6,6-tetramethyl-4-piperidyl benzoate, bis(2,2,6,6-tetramethyl-4-piperidyl) sebacate, bis(1,2,2,6,6-pentamethyl-4-piperidyl) sebacate, bis(1-octoxy-2,2,6,6-tetramethyl-4-piperidyl) sebacate, tetrakis(2,2,6,6-tetramethyl-4-piperidyl)-1,2,3,4-butane tetracarboxylate, tetrakis(1,2,2,6,6-pentamethyl-4-piperidyl)-1,2,3,4-butane tetracarboxylate, bis(2,2,6,6-tetramethyl-4-piperidyl).di(tridecyl)-1,2,3,4-butane tetracarboxylate, bis(1,2,2,6,6-pentamethyl-4-piperidyl).di(tridecyl)-1,2,3,4-butane tetracarboxylate, bis(1,2,2,4,4-pentamethyl-4-piperidyl)-2-butyl-2-(3,5-di-tert-butyl-4-hydroxybenzyl) malonate, polycondensates of 1-(2-hydroxyethyl)-2,2,6,6-tetramethyl-4-piperidinol and diethyl succinate, polycondensates of 1,6-bis(2,2,6,6-tetramethyl-4-piperidyl amino) hexane and 2,4-dichloro-6-morpholino-s-triazine, polycondensates of 1,6-bis(2,2,6,6-tetramethyl-4-piperidylamino)hexane and 2,4-dichloro-6-tert-octylamino-s-triazine, 1,5,8,12-tetrakis[2,4-bis(N-butyl-N-(2,2,6,6-tetramethyl-4-piperidyl)amino)-s-triazine-6-yl]-1,5,8,12-tetrazadodecane, 1,5,8,12-tetrakis[2,4-bis(N-butyl-N-(1,2,2,6,6-pentamethyl-4-piperidyl)amino)-s-triazine-6-yl]-1,5,8-12-tetrazadodecane, 1,6,11-tris[2,4-bis(N-butyl-N-(2,2,6,6-tetramethyl-4-piperidyl)amino)-s-triazine-6-yl]aminoun decane, and 1,6,11-tris[2,4-bis(N-butyl-N-(1,2,2,6,6-pentamethyl-4-piperidyl)amino)-s-triazine-6-yl]amino undecane.

In addition, examples of specific products thereof include TINUVIN 123, TINUVIN 144, TINUVIN 765, TINUVIN 770, TINUVIN 622, CHIMASSORB 944, and CHIMASSORB 119 (all of which are trade names manufactured by Ciba Specialty Chemicals K.K.), and ADEKA STAB LA52, ADEKA STAB LA57, ADEKA STAB LA62, ADEKA STAB LA67, ADEKA STAB LA82, ADEKA STAB LA87, and ADEKA STAB LX335 (all of which are trade names manufactured by Asahi Denka Kogyo Kahushiki Kaisha). However, there is no limitation thereto.

Among HALS, an antioxidant having relatively small molecules is preferable since the antioxidant easily diffuses from the antioxidant-containing interposing layer to the wavelength conversion layer. From this viewpoint, preferable HALS are compounds represented by ROC(=O)(CH$_2$)$_8$C(=O)OR, R'OC(=O)C(CH$_3$)=CH$_2$, and the like.

Among the above-described antioxidants AO, at least one of a hindered phenol compound, a hindered amine compound, a quinone compound, a hydroquinone compound, a tocopherol compound, an aspartic acid compound, or a thiol compound is more preferable, and at least one of a citric acid compound, an ascorbic acid compound, or a tocopherol compound is still more preferable. These compounds are not particularly limited and hindered phenol, hindered amine, quinone, hydroquinone, tocopherol, aspartic acid, thiol, citric acid, tocopheryl acetate, and tocopheryl phosphate themselves, or salts thereof and ester compounds thereof are preferable.

Hereinafter, the antioxidants AO used in the embodiments, which will be described later, will be described.

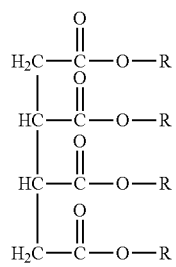 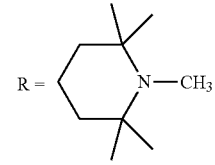

Tetrakis(1,2,2,6,6-pentamethyl-4-piperidyl)butane-1,2,3,4-tetracarboxylate (trade name: ADEKA STAB LA-52 manufactured by Adeka Corporation)

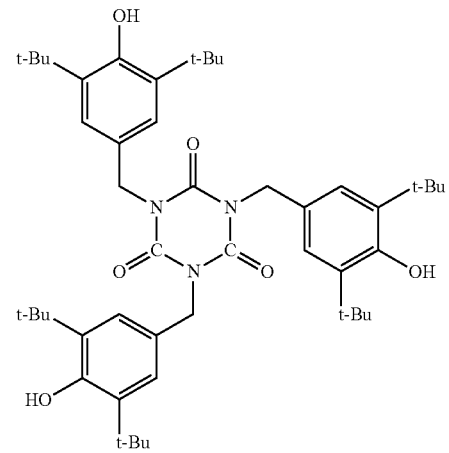

1,3,5-tris(3,5-di-tert-butyl-4-hydroxybenzyl)-1,3,5-triazine-2,4,6(1H,3H,5H)-trione
(trade name: ADEKA STAB AO-20 manufactured by Adeka Corporation)

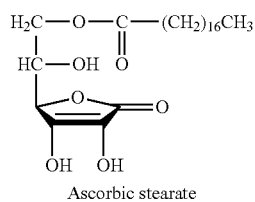

Ascorbic stearate

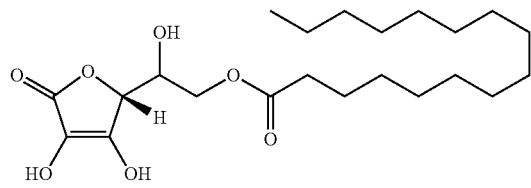

Ascorbate palmitate (ascorbyl palmitate)

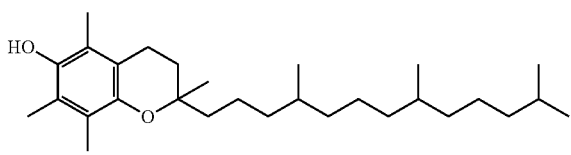

α tocopherol

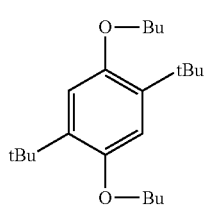

B-3

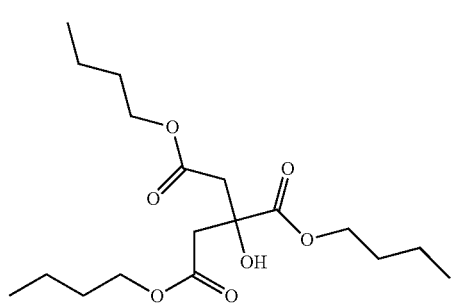

Tributyl citric acid

-continued

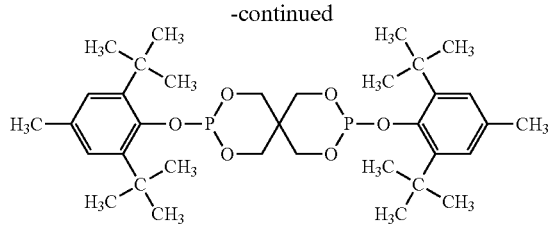

3,9-bis(2,6-di-tert-butyl-4-methylphenoxy)-2,4,8,10-
tetraoxa-3,9-diphosphaspiro[5.5]undecane
(trade name: ADEKA STAB PEP-36 manufactured by
Adeka Corporation)

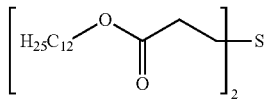

Dilauryl thiodipropionate (IRGANOX PS 800,
800 FD, manufactored by BASF SE)

[Wavelength Conversion Layer]

In the wavelength conversion layer 30, the quantum dots 30A and the quantum dots 30B are dispersed in an organic matrix 30P, in which the quantum dots 30A are excited by the blue light $L_B$ to emit the fluorescence (red light) $L_R$, and the quantum dots 30A are excited by the blue light $L_B$ to emit the fluorescence (green light) $L_G$. In FIG. 2, the quantum dots 30A and 30B are enlarged and shown in order to easily recognize the quantum dots. Actually, for example, the thickness of the wavelength conversion layer 30 is 50 to 100 μm, and the diameter of the quantum dot is about 2 to 7 nm.

The thickness of the wavelength conversion layer 30 is preferably in a range of 1 to 500 μm, more preferably in a range of 10 to 250 μm, and still more preferably in a range of 30 to 150 μm. It is preferable that the thickness is 1 μm or more because a high wavelength conversion effect can be obtained. In addition, it is preferable that the thickness is 500 μm or less because, in a case where the wavelength conversion member is incorporated into a backlight unit, the thickness of the backlight unit can be reduced.

Alternatively, in the wavelength conversion layer 30, the quantum dots 30A, the quantum dots 30B, and the quantum dots 30C may be dispersed in the organic matrix 30P, in which the quantum dots 30A are excited by ultraviolet light $L_{UV}$ to emit the fluorescence (red light) $L_R$, the quantum dots 30B are excited by the ultraviolet light $L_{UV}$ to emit the fluorescence (green light) $L_G$, and the quantum dots 30C are excited by the ultraviolet light $L_{UV}$ to emit the fluorescence (blue light) $L_B$. The shape of the wavelength conversion layer is not particularly limited and may be an arbitrary shape.

The wavelength conversion layer 30 contains the above-described antioxidant AO. The content of the antioxidant AO is preferably in a range of 0.1 to 20 mass % with respect to the total mass of the wavelength conversion layer 30. In the wavelength conversion layer 30, the antioxidant AO may be substantially evenly distributed or may be unevenly distributed.

In the first to ninth embodiments, the organic matrix 30P includes a polymer, and the wavelength conversion layer 30 can be obtained by curing a polymerizable composition including the quantum dots 30A and 30B and a polymerizable compound which forms the organic matrix 30P after being polymerized (hereinafter, referred to simply as "quantum dot-containing polymerizable composition"), and then allowing the antioxidant AO to diffuse from the adjacent antioxidant-containing interposing layer 40 into the wavelength conversion layer 30 obtained by curing with time. Accordingly, the wavelength conversion layer 30 can be manufactured by controlling the amount of a low-polymerization-degree component having a polymerization degree of 2 or more and 4 or less included in the wavelength conversion layer. According to the present invention, the amount of a low-polymerization-degree component having a polymerization degree of 2 or more and 4 or less included in the wavelength conversion layer 30 can be controlled to 5 mass % or less.

First, although not shown in the first to ninth embodiments, the wavelength conversion layer 30 may be provided with a wavelength conversion overcoat layer which covers the surface thereof. The wavelength conversion overcoat layer has a function of smoothing the surface of the wavelength conversion layer and a function of increasing the hardness, can be formed of, for example, one or organic layers, and can be formed using a well-known method, in the case of the embodiment, the wavelength conversion overcoat layer may be used as the antioxidant-containing interposing layer 40.

The wavelength conversion overcoat layer is not particularly limited, and the same polymer as the organic matrix 30P of the wavelength conversion layer 30 can be preferably used. As a preferable polymerizable compound which can form the polymer of the organic matrix 30P of the wavelength conversion layer 30, examples thereof are shown in the description of the quantum dot-containing polymerizable composition below and include: a polyfunctional acrylate such as dipentaerythritol hexaacrylate (DPHA), pentaerythritol tetraacrylate (PHA), or trimethylpropane tetraacrylate (TMPTA); an epoxy compound such as CELLOXIDE 2021P or CELLOXIDE 2000; and various acrylic polymers. That is, as the polymerizable composition used for forming the wavelength conversion overcoat layer, a polymerizable composition obtained by excluding the quantum dots from the quantum dot-containing polymerizable composition described below can be preferably used.

Although a method of forming the wavelength conversion layer 30 is not particularly limited, as described above, a method including applying a quantum dot-containing polymerizable composition which is a raw material composition of the wavelength conversion layer 30 to the surface of each of the barrier films 10 and 20 to form a precursor layer and then curing the composition by irradiation with light or heating is preferable. Examples of a coating method include various coating methods such as a curtain coating method, a dip coating method, a spin coating method, a printing coating method, a spray coating method, a slot coating method, a roll coating method, a slide coating method, a blade coating method, a gravure coating method, and a wire bar method.

Curing conditions can be appropriately set depending on the kind of the polymerizable compound used and the composition of the polymerizable composition. In addition, in a case where the quantum dot-containing polymerizable composition includes a solvent, a drying treatment is performed to remove the solvent before curing.

<Quantum Dot-Containing Polymerizable Composition

The quantum dot-containing polymerizable composition includes the quantum dots 30A and 30B and the polymerizable compound which forms the organic matrix 30P after polymerized. In addition to the above-described components, the quantum dot-containing polymerizable composition may further include other components such as a polymerization initiator or a silane coupling agent.

The quantum dot-containing polymerizable composition may contain the above-described antioxidant AO, but the content thereof is preferably set to be in such a range that the content of the low-polymerization-degree component having a polymerization degree of 2 or more and 4 or less is 5 mass % or less in the wavelength conversion layer 30 from the viewpoint of the durability of the wavelength conversion layer 30 after curing (refer to Examples described below).

A method of preparing the quantum dot-containing polymerizable composition is not particularly limited and may be prepared according to a preparation procedure of a general polymerizable composition.

(Quantum Dots)

The quantum dots may include two or more kinds of quantum dots having different light emitting properties. In the embodiment, the quantum dots include the quantum dots 30A which are excited by the blue light $L_B$ to emit the fluorescence (red light) $L_R$ and the quantum dots 30B which are excited by the blue light $L_B$ to emit the fluorescence (green light) $L_G$. In addition, the quantum dots may include the quantum dots 30A which are excited by the ultraviolet light $L_{UV}$ to emit the fluorescence (red light) $L_R$, the quantum dots 30B which are excited by the ultraviolet light $L_{UV}$ to emit the fluorescence (green light) $L_G$, and the quantum dots 30C which are excited by the ultraviolet light $L_{UV}$ to emit the fluorescence (blue light) $L_B$.

Examples of well-known kinds of quantum dots include the quantum dots 30A having a center emission wavelength in a wavelength range of 600 nm to 680 nm, the quantum dots 30B having a center emission wavelength in a wavelength range of 520 nm to 560 nm, and the quantum dots 30C (which emit blue light) having a center emission wavelength in a wavelength range of 400 nm to 500 nm.

In addition to the above description, the details of the quantum dots can be found in, for example, paragraphs "0060" to "0066" of JP2012-169271A, but the present invention is not limited thereto. As the quantum dots, a commercially available product can be used without any particular limitation. The emission wavelength of the quantum dots can be typically adjusted by adjusting the composition of particles, the size of particles, or both the composition and the size of particles.

The quantum dots may be added to the polymerizable composition in the form of particles or in the form of a dispersion in which they are dispersed in a solvent. It is preferable that the quantum dots are added in the form of a dispersion from the viewpoint of suppressing aggregation of particles of the quantum dots. The solvent used herein is not particularly limited. For example, 0.01 parts by mass to 10 parts by mass of the quantum dots can be added to the quantum dot-containing polymerizable composition with respect to 100 parts by mass of the total mass of the polymerizable composition.

The content of the quantum dots in the quantum dot-containing polymerizable composition is preferably 0.01 to 10 mass % and more preferably 0.05 to 5 mass % with respect to the total mass of the polymerizable compound in the polymerizable composition.

(Polymerizable Compound)

The polymerizable compound included in the quantum dot-containing polymerizable composition is not particularly limited and is preferably a radically polymerizable compound. From the viewpoints of transparency, adhesiveness, and the like of the cured coating film, it is preferable that the radically polymerizable compound is a monofunctional or polyfunctional (meth)acrylate monomer. The radically polymerizable compound may be a prepolymer or a polymer of the monofunctional or polyfunctional (meth)acrylate monomer as long as the prepolymer or polymer has polymerizable properties. In this specification, "(meth)acrylate" represents "either or both of acrylate and methacrylate". The same shall be applied to "(meth)acryloyl".

As the monofunctional (meth)acrylate monomer, for example, acrylic acid, methacrylic acid, or a derivative thereof can be used. More specifically, a monomer having one polymerizable unsaturated bond ((meth)acryloyl group) of (meth)acrylic acid in the molecule can be used.

Specific examples include: an alkyl (meth)acrylate with an alkyl group having 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, or stearyl (meth)acrylate; an aralkyl (meth)acrylate with an alkyl group having 7 to 20 carbon atoms such as benzyl (meth)acrylate; an alkoxyalkyl (meth)acrylate with an alkoxyalkyl group having 2 to 30 carbon atoms such as butoxyethyl (meth)acrylate an aminoalkyl (meth)acrylate with a (monoalkyl or dialkyl)aminoalkyl group having 1 to 20 carbon atoms in total such as N,N-dimethylaminoethyl (meth)acrylate; a polyalkylene glycol alkyl ether (meth)acrylate with an alkylene chain having 1 to 10 carbon atoms and a terminal alkyl ether having 1 to 10 carbon atoms such as diethylene glycol ethyl ether (meth)acrylate, triethylene glycol butyl ether (meth)acrylate, tetraethylene glycol monomethyl ether (meth)acrylate, hexaethylene glycol monomethyl ether (meth)acrylate, octaethylene glycol monomethyl ether (meth)acrylate, nonaethylene glycol monomethyl ether (meth)acrylate, dipropylene glycol monomethyl ether (meth)acrylate, heptapropylene glycol monomethyl ether (meth)acrylate, or tetraethylene glycol monoethyl ether (meth)acrylate; a polyalkylene glycol aryl ether (meth)acrylate with an alkylene chain having 1 to 30 carbon atoms and a terminal aryl ether having 6 to 20 carbon atoms such as hexaethylene glycol phenyl ether (meth)acrylate; a (meth)acrylate having an alicyclic structure and having 4 to 30 carbon atoms in total such as cyclohexyl (meth)acrylate, dicyclopentanyl (meth)acrylate, isobornyl (meth)acrylate, or a methylene oxide adduct of cyclodecatriene (meth)acrylate; a fluorinated alkyl(meth)acrylate having 4 to 30 carbon atoms in total such as heptadecafluorodecyl (meth)acrylate; a (meth)acrylate having a hydroxyl group such as 2-hydroxyethyl (meth)acrylate, 3-hydroxypropyl (meth)acrylate, 4-hydroxybutyl (meth)acrylate, triethylene glycol mono (meth)acrylate, tetraethylene glycol mono(meth)acrylate, hexaethylene glycol mono(meth)acrylate, octapropylene glycol mono(meth)acrylate, or glycerol mono(meth)acrylate or di(meth)acrylate; a (meth)acrylate having a glycidyl group such as glycidyl (meth)acrylate, a polyethylene glycol mono(meth)acrylate with an alkylene chain having 1 to 30 carbon atoms such as tetraethylene glycol mono(meth)acrylate, hexaethylene glycol mono(meth)acrylate, or octapropylene glycol mono(meth)acrylate; and a (meth)acrylamide such as (meth)acrylamide, N,N-dimethyl (meth)acrylamide, N-isopropyl (meth)acrylamide, 2-hydroxyethyl (meth)acrylamide, or acryloylmorpholine. The monofunctional (meth)acrylate monomer is not limited to this examples.

As the monofunctional (meth)acrylate monomer, an alkyl (meth)acrylate having 4 to 30 carbon atoms is preferable, and an alkyl (meth)acrylate having 12 to 22 carbon atoms is more preferable from the viewpoint of dispersibility of quantum dots. As the dispersibility of the quantum dots is improved, the amount of light directed from the wavelength conversion layer to an exit surface increases, which is efficient for improving front brightness and front contrast.

Specifically, as the monofunctional (meth)acrylate monomer, for example, butyl (meth)acrylate, octyl (meth)acrylate, lauryl (meth)acrylate, oleyl (meth)acrylate, stearyl (meth) acrylate, behenyl (meth)acrylate, butyl (meth)acrylamide, octyl (meth)acrylamide, lauryl (meth)acrylamide, oleyl (meth)acrylamide, stearyl (meth)acrylamide, or behenyl (meth)acrylamide is preferable. Among these, lauryl (meth) acrylate, oleyl (meth)acrylate, or stearyl (meth)acrylate is more preferable.

A monomer having one polymerizable unsaturated bond ((meth)acryloyl group) of the (meth)acrylic acid in the molecule and a polyfunctional (meth)acrylate monomer having two or more (meth)acryloyl groups in the molecule can also be used in combination.

Preferable examples of a bifunctional (meth)acrylate monomer among the bifunctional or higher (meth)acrylate monomers include neopentyl glycol di(meth)acrylate, 1,9-nonanediol di(meth)acrylate, tripropylene glycol di(meth) acrylate, ethylene glycol di(meth)acrylate, tetraethylene glycol di(meth)acrylate, hydroxypivalic acid neopentyl glycol di(meth)acrylate, polyethylene glycol di(meth)acrylate, dicyclopentenyl (meth)acrylate, dicyclopentenyloxyethyl (meth)acrylate, and dicyclopentanyl di(meth)acrylate.

In addition, preferable examples of a trifunctional (meth) acrylate monomer among the bifunctional or higher meth) acrylate monomers include epichlorohydrin (ECH)-modified glycerol tri(meth)acrylate; ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryoxyethyl)isocyanurate, dipentaerythritol hexa(meth)acrylate, dipentaerythritol penta(meth)acrylate, caprolactone-modified dipentaerythritol hexa(meth)acrylate, dipentaerythritol hydroxy enta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy tetra(meth)acrylate, and pentaerythritol tetra(meth) acrylate.

It is preferable that the quantum dot-containing polymerizable composition includes, as the radically polymerizable compound, a (meth)acrylate monomer in which a ratio Mw/F of the molecular weight Mw of the radically polymerizable compound to the number F of (meth)acryloyl groups per molecule is 200 or lower. Mw/F is preferably 150 or lower and more preferably 100 or lower. By using a (meth)acrylate monomer in which Mw/F is low, the oxygen permeability of the wavelength conversion layer which is formed by curing the quantum dot-containing polymerizable composition can be reduced, and thus the light resistance of the wavelength conversion member can be improved. In addition, by using a meth)acrylate monomer in which Mw/F is low, the crosslinking density of the polymer in the wavelength conversion layer can be increased, and the fracture of the wavelength conversion layer can be prevented, which is preferable.

Specific examples of the (meth)acrylate monomer in which Mw/F is 200 or lower include pentaerythritol triacrylate, pentaerythritol tetraacrylate, trimethylolpropane trimethacrylate, dipentaerythritol hexaacrylate, and tricyclodecane di methanol diacrylate.

The amount of the polyfunctional (meth)acrylate monomer used with respect to 100 parts by mass of the total amount of the polymerizable compound in the quantum dot-containing polymerizable composition is preferably 5 parts by mass or more from the viewpoint of the strength of the coating film and is preferably 95 parts by mass or less from the viewpoint of suppressing the gelation of the composition.

In addition, the amount of the radically polymerizable compound used with respect to 100 parts by mass of the total amount of the quantum dot-containing polymerizable composition is preferably 10 to 99.9 parts by mass, more preferably 50 to 99.9 parts by mass, and particularly preferably 92 to 99 parts by mass.

In addition, as the polymerizable compound included in the quantum dot-containing polymerizable composition, an alicyclic epoxy compound is preferable. The amount of the alicyclic epoxy compound contained in the quantum dot-containing polymerizable composition is preferably 30 mass % or more, more preferably 50 mass % or more, and still more preferably 80 mass % or more from the viewpoint of oxygen barrier properties.

As the alicyclic epoxy compound, one kind may be used, or two or more kinds having different structures may be used. In the following description, in a case where two or more kinds having different structures are used as the alicyclic epoxy compound, the content of the alicyclic epoxy compound refers to the total content thereof. The same shall be applied to a case where two or more kinds having different structures are used as other components.

The alicyclic epoxy compound has higher curing properties by light irradiation than an aliphatic epoxy compound. It is preferable that a polymerizable compound having excellent photocuring properties is used from the viewpoints of improving productivity and forming a layer in which an irradiated portion and a non-irradiated portion have uniform properties. As a result, in the wavelength conversion member, the curling of the wavelength conversion layer can be suppressed, and the quality can be made to be uniform. In general, an epoxy compound is likely to have a reduced curing shrinkage during photocuring. This point is advantageous in forming a smooth wavelength conversion layer having a reduced deformation.

The alicyclic epoxy compound includes at least one alicyclic epoxy group. Here, the alicyclic epoxy group refers to a monovalent substituent having a condensed ring of an epoxy ring and a saturated hydrocarbon ring and preferably a monovalent substituent having a condensed ring of an epoxy ring and a cycloalkane ring. Preferable examples of the alicyclic epoxy compound include a compound having one or more structures shown below in one molecule, in which an epoxy ring and a cyclohexane ring are condensed.

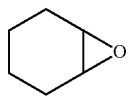

The number of the structures included in one molecule may be two or more and is preferably one or two.

In addition, the structure may include one or more substituents. Examples of the substituent include an alkyl group (for example, an alkyl group having 1 to 6 carbon atoms), a hydroxyl group, an alkoxy group (for example, an alkoxy group having 1 to 6 carbon atoms), and a halogen atom (for example, a fluorine atom, a chlorine atom, or a bromine atom), a cyano group, an amino group, a nitro group, an acyl group, and a carboxyl group. The structure may have the above-described substituent but is preferably unsubstituted.

In addition, the alicyclic epoxy compound may include a polymerizable functional group other than the alicyclic epoxy group. The polymerizable functional group refers to a functional group which can cause a polymerization reaction to occur by radical polymerization or cationic polymerization, and examples thereof include a (meth)acryloyl group.

Preferable examples of a commercially available product of the alicyclic epoxy compound include: CELLOXIDE (registered trade name) 2000, CELLOXIDE 2021P, CELLOXIDE 3000, CELLOXIDE 8000, CYCLOMER (registered trade name) M100, EPOLEAD GT 301, and EPOLEAD GT 401 (all of which are manufactured by Daicel Corporation); 4-vinylcyclohexene dioxide (manufactured by Sigma-Aldrich Co., LLC.); D-limonene oxide (manufactured by Nippon Terpene Chemicals, Inc.); and SANSO-CIZER (registered trade name) E-PS (manufactured by New Japan Chemical Co., Ltd.). Among these, one kind can be used alone, or two or more kinds can be used in combination.

From the viewpoint of improving adhesiveness between the wavelength conversion layer and a layer adjacent thereto, the following alicyclic epoxy compound I or II is more preferable. As a commercially available product of the alicyclic epoxy compound I, CELLOXIDE 2021P (manufactured by Daicel Corporation) can be used. As a commercially available product of the alicyclic epoxy compound II, CYCLOMER M100 (manufactured by Daicel Corporation) can be used.

Alicyclic epoxy compound I

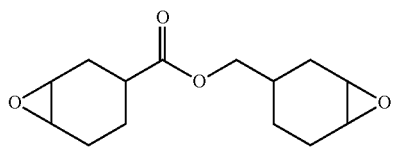

Alicyclic epoxy compound II

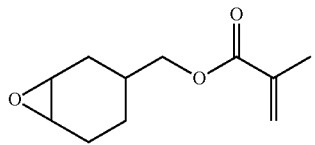

In addition, the alicyclic epoxy compound can also be synthesized using a well-known method. A method of preparing the alicyclic epoxy compound is not particularly limited. For example, the alicyclic epoxy compound can be synthesized with reference to "The Fourth Series of Experimental Chemistry, 20 Organic Synthesis II, pp. 213-(Maruzen-Yushodo Co., Ltd., 1992), "The chemistry of heterocyclic compounds-Small Ring Heterocycles, part 3 Oxiranes" (Ed. by Alfred Hasfner, John Wiley and Sons, An Interscience Publication, New York, 1985), "Adhesion, Vol, 29, No. 12, 32" (Yoshimura, 1985), "Adhesion, Vol. 30, No. 5, 42" (Yoshimura, 1986), "Adhesion, Vol. 30, No. 7, 42" (Yoshimura, 1986), JP1999-100378A (JP-H11-100378A), and JP2926262B.

In a case where the alicyclic epoxy compound is used as a polymerizable compound, one or more other polymerizable compounds may be included in the compound. As the other polymerizable compounds, a (meth)acrylate compound such as a monofunctional (meth)acrylate compound or a polyfunctional (meth)acrylate compound, an oxirane compound, or an oxetane compound is preferable. In the present invention and this specification, a (meth)acrylate compound or (meth)acrylate represents a compound having one or more (meth)acryloyl groups in one molecule, and a (meth)acryloyl group represents either or both of an acryloyl group and a methacryloyl group.

The oxirane compound is also called ethylene oxide, and representative examples thereof include a functional group called a glycidyl group. In addition, the oxetane compound is a 4-membered cyclic ether. By using this polymerizable compound, for example, the (meth)acrylate compound in combination with the alicyclic epoxy compound, the (meth)acrylate compound and a polymer of the alicyclic epoxy compound forms an interpenetrating polymer network (IPN), and a polymer can be designed so as to exhibit desired mechanical properties and optical properties. In addition, the oxirane compound or the oxetane compound is copolymerizable with the alicyclic epoxy compound, and a polymer can be designed so as to exhibit desired mechanical properties and optical properties. In addition, by using these compounds in combination, the viscosity of the composition before curing, the dispersibility of the quantum dots, and the solubility of a photopolymerization initiator described below and other additives can also be adjusted.

In addition, the content of the curable compound including an alicyclic epoxy compound is preferably 10 to 99.9 mass %, more preferably 50 to 99.9 mass %, and still more preferably 92 to 99 mass % with respect to the total mass of the total amount of the quantum dot-containing curable composition.

(Polymerization Initiator)

Optionally, the quantum dot-containing polymerizable composition may include a polymerization initiator. As the polymerization initiator, a polymerization initiator which is preferable depending on the kind of the polymerizable compound in the quantum dot-containing polymerizable composition is preferably used. In a case where the polymerizable compound is radically polymerizable, the quantum dot-containing polymerizable composition may include a well-known radical initiator. The details of the polymerization initiator can be found in paragraph "0037" of JP2013-043382A. The content of the polymerization initiator is preferably 0.1 mol % or higher and more preferably 0.5 mol % to 2 mol % with respect to the total mass of the polymerizable compound included in the quantum dot-containing polymerizable composition.

A cured product may be tinged with light yellow by combining the above-described alicyclic epoxy compound with an initiator, and the excitation light with which the wavelength conversion member is irradiated is partially absorbed by the alicyclic epoxy compound to causes deterioration in brightness. For the alicyclic epoxy compound, this problem can be reduced by using an iodonium salt compound, for example, an iodonium salt compound A shown below.

Photocationic Polymerization Initiator (Iodonium Salt Compound) A

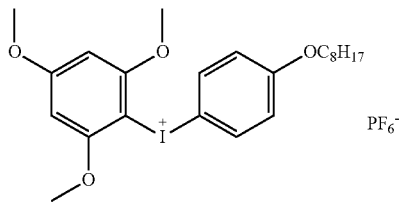

(Silane Coupling Agent)

The quantum dot-containing polymerizable composition may further include a silane coupling agent. Since the adhesiveness between the wavelength conversion layer formed of a polymerizable composition including a silane coupling agent and the adjacent layer becomes strong by the silane coupling agent, further excellent light resistance can be exhibited. This is mainly because the silane coupling agent included in the wavelength conversion layer forms a covalent bond with the surface of the adjacent layer and the constituent component of the layer through a hydrolysis reaction or a condensation reaction. In this case, an inorganic barrier layer, which will be described later, is preferably provided as the adjacent layer. In addition, in a case in which the silane coupling agent has a reactive functional group such as a radical polymerizable group or the like, the formation of a crosslinking structure with a monomer component constituting the wavelength conversion layer can also provide an improvement in adhesiveness between the wavelength conversion layer and the adjacent layer. In the specification, the silane coupling agent included in the wavelength conversion layer is used as the meaning including the form of the silane coupling agent the form after the above reactions.

For the silane coupling agent, a known silane coupling agent can be used without any limitation. A preferable silane coupling agent in terms of adhesiveness can include a silane coupling agent represented by Formula (1) described in JP2013-43382A. With respect to the details thereof, paragraphs 0011 to 0016 of JP2013-43382A can be referenced. The amount of an additive used such as a silane coupling agent is not particularly limited and can be appropriately set.

(Solvent)

Optionally, the quantum dot-containing polymerizable composition may include a solvent. In this case, the kind and addition amount of the solvent used are not particularly limited. For example, as the solvent, one organic solvent or a mixture of two or more organic solvents may be used.

<Barrier Film (Substrate)>

The barrier films 10 and 20 are films having a function of suppressing permeation of water and/or oxygen. In the embodiment, the barrier layers 12 and 22 are provided on the supports 11 and 21, respectively. In this configuration, clue to the presence of the supports, the strength of the wavelength conversion member 1D is improved, and the films can be easily manufactured.

In the wavelength conversion members according to the embodiment, the barrier films 10 and 20 in which the barrier layers 12 and 22 are supported by the supports 11 and 21 are provided such that the barrier layers 12 and 22 are adjacent to both main surfaces of the wavelength conversion layer 30. However, the barrier layers 12 and 22 are not necessarily supported by the supports 11 and 21. In addition, in a case where the supports 11 and 21 have sufficient barrier properties, the barrier layers may include only the supports 11 and 21.

In addition, it is preferable that the wavelength conversion member includes the two barrier films 10 and 20, that is, the barrier layers are provided on both surfaces of the wavelength conversion layer 30, as in the embodiment. However, the wavelength conversion member may include one barrier film.

The total light transmittance of the barrier film in the visible range is 80% or higher and more preferably 90% or higher. The visible range refers to a wavelength range of 380 nm to 780 nm, and the total light transmittance refers to an average light transmittance value in the visible range.

The oxygen permeability of the barrier films 10 and 20 is preferably 1.00 $cm^3/(m^2 \cdot day \cdot atm)$ or lower. Here, the oxygen permeability is a value measured using an oxygen permeability measuring device (OX-TRAN 2/20 (trade name), manufactured by Mocon Inc.) under conditions of measurement temperature: 23° C. and relative humidity: 90%. The oxygen permeability of the barrier film 10 and 20 is more preferably 0.10 $cm^3/(m^2 \cdot day \cdot atm)$ or lower, still more preferably 0.01 $cm^3/(m^2 \cdot day \cdot atm)$ or lower.

The barrier films 10 and 20 have not only a gas barrier function of blocking oxygen and a function of blocking water (water vapor). In the wavelength conversion member 1D, the moisture permeability (water vapor transmission rate) of the barrier film 10 and 20 is 0.10 $g^2/(m^2 \cdot day \cdot atm)$ or lower. The moisture permeability of the barrier film 10 and 20 is preferably 0.01 $g/(m^2 \cdot day \cdot atm)$ or lower.

(Support)

In the wavelength conversion member 1D, at least one main surface of the wavelength conversion layer 30 is supported by the support 11 or 21. Here, "main surface" refers to a surface (a front surface or a rear surface) of the wavelength conversion layer which is disposed on a visible side or a backlight side in a case where the wavelength conversion member is used. The same can also be applied to main surfaces of other layers and members.

As in the embodiment, it is preferable that front and rear main surfaces of the wavelength conversion layer 30 are supported by the supports 11 and 21.

From the viewpoints of impact resistance and the like of the wavelength conversion member, the average thickness of the supports 11 and 21 is preferably 10 μm to 500 μm, more preferably 20 μm to 400 μm, and still more preferably 30 μm to 300 μm. In a configuration where the retroreflection of light is increased as in a case where the concentration of the quantum dots 30A and 30B in the wavelength conversion layer 30 is reduced or a case where the thickness of the wavelength conversion layer 30 is reduced, it is preferable that the absorbance of light at a wavelength of 450 nm is low. Therefore, from the viewpoint of suppressing a decrease in brightness, the average thickness of the supports 11 and 21 is preferably 40 μm or less and more preferably 25 μm or less.

In order to further reduce the concentration of the quantum dots 30A and 30B in the wavelength conversion layer 30 or to further reduce the thickness of the wavelength conversion layer 30, it is necessary that the number of times where the excitation light passes through the wavelength conversion layer is increased by providing means for increasing retroreflection of light, for example, a plurality of prism sheets in the retroreflecting member 29 of the backlight unit to maintain a display color of a LCD. Accordingly, it is preferable that the support is a transparent support which is transparent to visible light. Here, "transparent to visible light" represents that the light transmittance in the visible range is 80% or higher and preferably 85% or higher. The light transmittance used as an index for transparency can be measured using a method described in JIS-K 7105. That is, using an integrating sphere light transmittance measuring device, the total light transmittance and the scattered light amount are measured, and the diffuse transmittance is subtracted from the total light transmittance to obtain the light transmittance. The details of the support can be found in paragraphs "0046" to "0052" of JP2007-290369A and paragraphs "0040" to "0055" of JP2005-096108A.

In addition, the in-plane retardation Re(589) of the supports 11 and 21 at a wavelength of 589 nm is preferably 1000 nm or lower, more preferably 500 nm or lower, and still more preferably 200 nm or lower.

In a case where whether or not foreign matter or defects are present is inspected after the preparation of the wavelength conversion member 1D, foreign matter or defects can be easily found by disposing two polarizing plates at extinction positions and inserting the wavelength conversion member between the two polarizing plates to observe the wavelength conversion member. In a case where Re(589) of the support is in the above-described range, foreign matter or defects can be easily found during the inspection using the polarizing plates, which is preferable.

Here, Re(589) is measured using KOBRA 21ADH or WR (manufactured by Oji Scientific Instruments Co., Ltd.) by causing light at a wavelength of 589 nm to be incident in a film normal direction. The measurement wavelength λ nm can be selected by manually changing a wavelength selective filter or changing a measured value using a program or the like.

As the supports 11 and 21, a support having barrier properties against oxygen and water is preferable. Preferable examples of the support include a polyethylene terephthalate film, a film which includes a polymer having a cyclic olefin structure, and a polystyrene film.

(Barrier Layer)

It is preferable that the support 11 or 21 includes the barrier layer 12 or 22 including at least one inorganic barrier layer 12b or 22b which is formed to be adjacent to a surface on the wavelength conversion layer 30 side.

As shown in FIG. 2, the barrier layer 12 or 22 may include at least one organic barrier layer 12a or 22a which is formed between the support 11 or 21 and the inorganic barrier layer 12b or 22b. The organic barrier layer 12a or 22a may be provided between the inorganic barrier layer 12b or 22b and the wavelength conversion layer 30. As in the first embodiment and the second embodiment, the organic barrier layer 12a or 22a may be provided as a third barrier layer between the inorganic barrier layer 22b and the wavelength conversion layer 30. The organic barrier layer closest to the wavelength conversion layer 30 side is called a barrier overcoat layer. From the viewpoint of improving light resistance, it is preferable that a plurality of barrier layers are provided because barrier properties can be further improved. In addition, in the configuration where the barrier overcoat layer 22c is provided, an effect of improving scratch resistance of the barrier layer and an effect of improving peelability can be further obtained. As shown in the first embodiment to the fifth embodiment, the barrier overcoat layers 12c and 22c are preferable as the antioxidant-containing interposing layer 40.

The barrier layer 12 or 22 is formed on a surface of the support 11 or 21. Accordingly, the barrier film 10 or 20 includes: the support 11 or 21; and the barrier layer 12 or 22 that is formed on the support 11 or 21. In a case where the barrier layer 12 or 22 is provided, it is preferable that the support has high heat resistance. In the wavelength conversion member 1D, a layer of the barrier film 10 or 20 which is adjacent to the wavelength conversion layer 30 may be an inorganic barrier layer or an organic barrier layer and is not particularly limited.

From the viewpoint of improving light resistance, it is preferable that the barrier layer 12 or 22 includes a plurality of layers because barrier properties can be further improved. However, as the number of layers increases, the light transmittance of the wavelength conversion member is likely to decrease. Therefore, it is preferable that the barrier layer 12 or 22 is designed in consideration of excellent light transmittance and barrier properties.

[Inorganic Barrier Layer]

"Inorganic layer" is a layer including an inorganic material as a major component and is preferably a layer consisting only of an inorganic material.

The inorganic barrier layer 12b or 22b which is preferable for the barrier layer 12 or 22 is not particularly limited, and various inorganic compounds such as a metal, an inorganic oxide, an inorganic nitride, or an inorganic oxynitride can be used. As an element constituting the inorganic material, silicon, aluminum, magnesium, titanium, tin, indium, or cerium is preferable. The inorganic material may include one element or two or more elements among the above elements. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. In addition, as the inorganic barrier layer, a metal film such as an aluminum film, a silver film, a tin film, a chromium film, a nickel film, or a titanium film may be provided.

In particular, an inorganic barrier layer including silicon oxide, silicon nitride, silicon carbide, or aluminum oxide is preferable. The inorganic barrier layer formed of the above materials has excellent adhesiveness with the organic barrier layer. Therefore, in a case where a pin hole is formed on the inorganic barrier layer, the organic barrier layer can be effectively embedded in the pin hole, and barrier properties can be further suppressed.

In addition, it is more preferable that the inorganic barrier layer is formed of a silicon nitride from the viewpoint of suppressing light absorption in the barrier layer.

A method of forming the inorganic barrier layer is not particularly limited. For example, various film forming methods in which a film forming material can be evaporated or scattered to be deposited on a deposition target surface can be used.

Examples of the method of forming the inorganic barrier layer include: a vacuum deposition method of heating and depositing an inorganic material such as an inorganic oxide, an inorganic nitride, an inorganic oxynitride, or a metal; an oxidation deposition method of introducing oxygen gas and oxidizing an inorganic material as a raw material for deposition; a sputtering method of introducing argon gas and oxygen gas and sputtering an inorganic material as a target material for deposition; a physical vapor deposition (PVD) method, such as an ion plating method, of heating an inorganic material with a plasma beam generated by a plasma gun for deposition; and in a case where a deposited film formed of silicon oxide is formed, a chemical vapor deposition method of using an organic silicon compound as a raw material.

The thickness of the inorganic barrier layer may be 1 nm to 500 nm and is preferably 5 nm to 300 nm and more preferably 10 nm to 150 nm. By adjusting the thickness of the adjacent inorganic layer to be in the above-described range, light absorption in the inorganic barrier layer can be suppressed while realizing excellent barrier properties, and the wavelength conversion member having a high light transmittance can be provided.

[Organic Barrier Layer]

"Organic layer" is a layer including an organic material as a major component in which the content of the organic material is preferably 50 mass % or higher, more preferably 80 mass % or higher, and still more preferably 90 mass % or higher. The details of the organic barrier layer can be found in paragraphs "0020" to "0042" of JP2007-290369A and paragraphs "0074" to "0105" of JP2005-096108A. It is preferable that the organic barrier layer includes a cardo polymer. As a result, adhesiveness between the organic barrier layer and an adjacent layer, in particular, adhesiveness between the organic barrier layer and the inorganic barrier layer is improved, and more favorable barrier properties can be realized. The details of the cardo polymer can be found in paragraphs "0085" to "0095" of JP2005-096108A. The thickness of the organic barrier layer is preferably in a range of 0.05 μm to 10 μm and more preferably in a range of 0.5 to 10 μm. In a case where the organic barrier layer is formed using a wet coating method, the thickness of the organic barrier layer is preferably in a range of 0.5 to 10 μm and more preferably in a range of 1 μm to 5 μm. In a case where the organic layer is formed using a dry coating method, the thickness of the organic layer is preferably in a range of 0.05 μm to 5 μm and more preferably in a range of 0.05 μm to 1 μm. By adjusting the thickness of the organic harrier layer, which is formed using a wet coating method or a dry coating method, adhesiveness with the inorganic layer can be further improved.

Other details of the inorganic barrier layer and the organic barrier layer can be found in JP2007-290369A, JP2005-096108A, and US2012/0113672A1.

(Design Change of Barrier Film)

In the wavelength conversion member 1D, the wavelength conversion layer, the inorganic barrier layer, the organic barrier layer, and the support may be laminated in this order. The support may be provided between the inorganic barrier layer and the organic barrier layer, between two organic barrier layers, or between two inorganic barrier layers.

(Unevenness Imparting Layer (Mat Layer))

It is preferable that the barrier film 10 or 20 includes an unevenness imparting layer (mat layer) which imparts an uneven structure to a surface of the barrier film 10 opposite to the wavelength conversion layer 30 side. In a case where the barrier film includes the mat layer, blocking properties and slipping properties of the barrier film can be improved, which is preferable. It is preferable that the mat layer is layer including particles. Examples of the particles include inorganic particles such as silica, alumina, a metal oxide and organic particles such as crosslinked polymer particles. In addition, it is preferable that the mat layer is provided on a surface of the barrier film opposite to the wavelength conversion layer. However, the mat layer may be provided on opposite surfaces of the barrier film.

(Pressure Sensitive Adhesive Layer)

The wavelength conversion member 1D which is manufactured using a second manufacturing method described below may include a pressure sensitive adhesive layer 50 as in the sixth embodiment. The pressure sensitive adhesive layer 50 is not particularly limited, and examples thereof preferably include a layer obtained by curing an adhesive. Various adhesives which are used for manufacturing a polarizing plate in the related art can be used as long as they are curable. From the viewpoints of weather fastness, polarizability, and the like, an adhesive which is curable by active energy rays such as ultraviolet light is preferable. Among the adhesives which are curable by active energy rays, an active energy ray-curable adhesive which includes, as one active energy ray-curable component, a canonically polymerizable compound, for example, an epoxy compound, more specifically, an epoxy compound not having an aromatic ring in the molecule as described in JP2004-245925A is preferable. In addition, with the active energy ray-curable adhesive, not only a canonically polymerizable compound such as an epoxy compound as a representative example but also typically a polymerization initiator, in particular, a photo-cationic polymerization initiator for generating a cationic species or Lewis acid to initiate polymerization of the canonically polymerizable compound by irradiation with active energy rays are mixed. Further, various additives such as a thermal cationic polymerization initiator which initiates polymerization by heating or a photosensitizer may be mixed with the active energy ray-curable adhesive.

As shown in the sixth embodiment, the pressure sensitive adhesive layer 50 is also preferable as the antioxidant-containing interposing layer 40.

(Light Scattering Layer)

The wavelength conversion member 1D may have a light scattering function for efficiently extracting the fluorescence of the quantum dots to the outside. The light scattering function may be provided in the wavelength conversion layer 30, or a layer having a light scattering function may be separately provided as a light scattering layer.

The light scattering layer may be provided on a surface of the barrier layer 22 on the wavelength conversion layer 30 side, or may be provided on a surface of the support opposite to the wavelength conversion layer.

In a case where the mat layer is provided, it is preferable that the mat layer functions not only as an unevenness imparting layer but also as a light scattering layer.

[Backlight Unit]

As described above, the backlight unit 2 shown in FIG. 1 includes: a surface light source 1C including a light source 1A, which emits primary light (blue light $L_B$), and a light guide plate 1B which guides and emits the primary light emitted from the light source 1A; a wavelength conversion member 1D that is provided on the surface light source 1C; a retroreflecting member 2B that is disposed to face the surface light source 1C with the wavelength conversion member 1D interposed therebetween; and a reflection plate 2A that is disposed to face the wavelength conversion member 1D with the surface light source 1C interposed therebetween. The wavelength conversion member 1D are excited by excitation light, which is at least a portion of the primary light $L_B$ emitted from the surface light source 1C, to emit fluorescence and emits secondary light ($L_G$, $L_R$) which includes the fluorescence and the primary light $L_B$ which does not function as excitation light.

From the viewpoint of realizing high brightness and high color reproducibility, it is preferable that the backlight unit includes a multi-wavelength light source. For example, it is preferable that blue light having a center emission wavelength in a wavelength range of 430 to 480 nm and having a full width at half maximum of emission intensity peak of 100 nm or less, green light having a center emission wavelength in a wavelength range of 520 to 560 nm and having a full width at half maximum of emission intensity peak of 100 nm or less, and red light having a center emission wavelength in a wavelength range of 600 to 680 nm and having a full width at half maximum of emission intensity peak of 100 nm or less are emitted.

From the viewpoint of further improving brightness and color reproducibility, the wavelength range of the blue light emitted from the backlight unit 2 is preferably 430 to 480 nm and more preferably 440 to 460 nm.

From the same viewpoint, the wavelength range of the green light emitted from the backlight unit 2 is preferably 520 to 560 nm and more preferably 520 to 545 nm.

In addition, from the same viewpoint, the wavelength range of the red light emitted from the backlight unit is preferably 600 to 680 nm and more preferably 610 to 640 nm.

In addition, from the same point, the full width at half maximum of the emission intensity of each of the blue light, the green light, and the red light emitted from the backlight unit is preferably 80 nm or less, more preferably 50 nm or less, still more preferably 40 nm or less, and still more preferably 30 nm or less. In particular, it is more preferable that the full width at half maximum of the emission intensity of the blue light is 25 nm or less.

The backlight unit 2 includes at least the wavelength conversion member 1D and the surface light source 1C. As the light source 1A, for example, a light source which emits blue light having a center emission wavelength in a wavelength range of 430 nm to 480 nm, or a light source which emits ultraviolet light can be used. As the light source 1A, for example, a light emitting diode or a laser light source can be used.

As shown in FIG. 1, the surface light source 1C may include: the light source 1A; and the light guide plate 1B that guides and emits the primary light emitted from the light source 1A. Alternatively, the surface light source 1C may include: the light source 1A that is disposed along with a plane parallel to the wavelength conversion member 1D; and a diffusion plate 1E that is provided instead of the light guide plate 1B. The former surface light source is called an edge light mode, and the latter surface light source is called a direct backlight mode.

In the embodiment, the example in which the surface light source is used as the light source has been described. As the light source, a light source other than the surface light source can also be used.

(Configuration of Backlight Unit)

In the above description regarding FIG. 1, the configuration of the backlight unit is an edge light mode including a light guide plate or a reflection plate as a component. However, the configuration of the backlight unit may be a direct backlight mode. As the light guide plate, a well-known light guide plate can be used without any particular limitation.

In addition, as the reflection plate 2A, a well-known reflection plate can be used without any particular limitation. The details of the reflection plate 2A can be found in JP3416302B, JP3363565B, JP4091978B, and JP3448626B, the contents of which are incorporated herein by reference.

The retroreflecting member 2B may be formed of a well-known diffusion plate, a diffusion sheet, a prism sheet (for example, BEF series, manufactured by Sumitomo 3M Ltd.), or a light guide. The configuration of the retroreflecting member 2B can be found in JP3416302B, JP3363565B, JP4091978B, and JP3448626B, the contents of which are incorporated herein by reference.

[Liquid Crystal Display Device]

Figure 13:
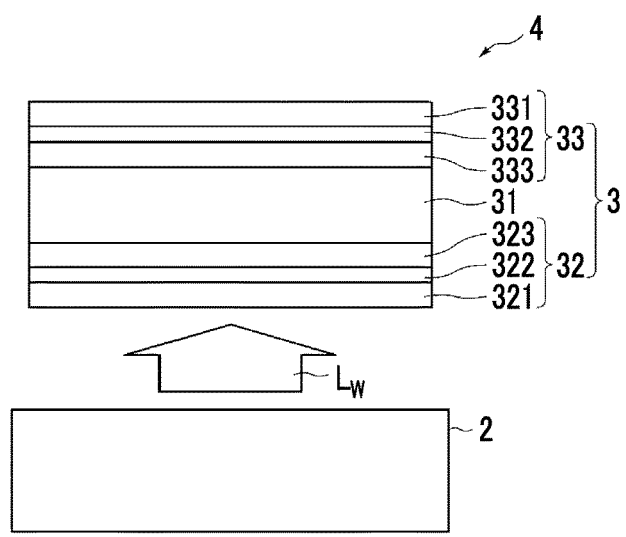
FIG. 13 is a cross-sectional view showing a schematic configuration of a liquid crystal display device including a backlight unit according to an embodiment of the present invention.

The above-described backlight unit 2 can be applied to a liquid crystal display device. As shown in FIG. 13, a liquid crystal display device 4 includes: the backlight unit 2 according to the embodiment; and a liquid crystal cell unit 3 to which light emitted from the backlight unit 2 is incident.

In the liquid crystal cell unit 3, as shown in FIG. 13, a liquid crystal cell 31 is interposed between polarizing plates 32 and 33. In the polarizing plates 32 and 33, both main surfaces of polarizers 322 and 332 are protected by polarizing plate protective films 321 and 323 and polarizing plate protective films 331 and 333, respectively.

Regarding each of the liquid crystal cell 31, the polarizing plates 32 and 33, and other components which constitute the liquid crystal display device 4, a product prepared using a well-known method or a commercially available product can be used without any particular limitation. In addition, of course, a well-known interlayer such as a pressure sensitive adhesive layer can be provided between respective layers.

As a driving mode of the liquid crystal cell 31, various modes such as a twisted nematic (TN) mode, a super twisted nematic (STN) mode, a vertical alignment (VA) mode, an in-plane switching (IPS) mode, or an optically compensated bend (OCB) mode can be used without any particular limitation. The liquid crystal cell is preferably a VA mode, an OCB mode, an IPS mode, or a TN mode but is not limited thereto. Examples of the configuration of the VA mode liquid crystal display device include a configuration shown in FIG. 2 described in JP2008-262161A. However, a specific configuration of the liquid crystal display device is not particularly limited, and a well-known configuration can be adopted.

Optionally, the liquid crystal display device 4 further includes an optical compensation member for optical compensation or a sub-functional layer such as a pressure sensitive adhesive layer. Further, in addition to (or instead of) a color filter substrate, a thin film transistor substrate, a lens film, a diffusion sheet, a hard coat layer, an anti-reflection layer, a low-reflection layer, or an anti-glare layer, a surface layer such as a forward scattering layer, a primer layer, an antistatic layer, or a undercoat layer may be disposed.

The backlight-side polarizing plate 32 may include a phase difference film as the polarizing plate protective film 323 on the liquid crystal cell 31 side. As this phase difference film, for example, a well-known cellulose acylate film can be used.

The backlight unit 2 and the liquid crystal display device 4 includes the wavelength conversion member according to the present invention having a small light loss. Therefore, the backlight unit 2 and the liquid crystal display device 4 exhibit the same effects as those of the wavelength conversion member according to the present invention, in which peeling at an interface of the wavelength conversion layer including quantum dots is not likely to occur, the emission intensity is not likely to decrease, and the brightness is high.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

(Preparation of Barrier Films 1 and 2)

As a support, a polyethylene terephthalate (PET) film (trade name: COSMOSHINE (registered trademark) A4300, manufactured by Toyobo Co., Ltd.) having a thickness of 50

μm was used, and an organic layer and an inorganic layer were formed in this order on a single surface of the support in the following procedure.

(Formation of Organic Layer)

Trimethylolpropane triacrylate (trade name "TMPTA", manufactured by Daicel-Cytec Co., Ltd.) and a photopolymerization initiator (trade name "ESACURE (registered trade mark) KTO46", manufactured by Lamberd S.p.A.) were prepared and were weighed such that a mass ratio thereof was 95:5. These components were dissolved in methyl ethyl ketone. As a result, a coating solution having a solid content concentration of 15% was obtained. This coating solution was applied to the PET film using a roll-to-roll method with a die coater and was allowed to pass through a drying zone at 50° C. for 3 minutes. Next, in a nitrogen atmosphere, the coating solution was irradiated with ultraviolet light (cumulative irradiation dose: about 600 mJ/cm$^2$) to be cured, and the PET film was wound. The thickness of the organic layer formed on the support was 1 μm.

(Formation of Inorganic Layer)

Next, using a roll-to-roll CVD apparatus, an inorganic layer (silicon nitride layer) was formed on a surface of the organic layer. As raw material gases, silane gas (flow rate: 160 sccm), ammonia gas (flow rate: 370 sccm), hydrogen gas (flow rate: 590 sccm), and nitrogen gas (flow rate: 240 sccm) were used. As a power supply, a high-frequency power supply having a frequency of 13.56 MHz was used. The film forming pressure was 40 Pa, and the achieved thickness was 50 nm. In this way, a film in which the inorganic layer was laminated on the surface of the organic layer formed on the support was prepared.

(Preparation of Barrier Overcoat Layer)

A urethane skeleton acrylic polymer (ACRYD 8BR500, manufactured by Taisei Fine Chemical Co., Ltd.) and a photopolymerization initiator (Iragacure 184, manufactured by BASF SE) were weighed such that a mass ratio thereof was 95:5, and these components were dissolved in methyl ethyl ketone. As a result, a coating solution having a solid content concentration of 15% was prepared and used as a coating solution for a first barrier overcoat layer.

In addition, an antioxidant was added to the coating solution for a first barrier overcoat layer in a concentration of 1.0 mass % to prepare a coating solution for a second barrier overcoat layer. As the added antioxidant, the antioxidants in each example in Table 1 were used.

The prepared coating solution for a first barrier overcoat layer was applied to the surface of the inorganic layer of the barrier film 1 using a roll-to-roll method with a die coater and was allowed to pass through a drying zone at 100° C. for 3 minutes to form an overcoat layer. Then, the laminate was wounded to prepare a barrier film 1 with the first overcoat layer. In addition, in the same way, the coating solution for a second barrier overcoat layer prepared was used to prepare a barrier film 2 with the second overcoat layer (containing the antioxidant). The thickness of the overcoat layer formed on the support was 1 μm.

(Preparation of Light Scattering Layer Laminated Barrier Films 1-A and 2-A)

—Preparation of Light Scattering Layer Forming Polymerizable Composition—

As light scattering particles, 150 g of silicone resin particles (TOSPEARL 120 manufactured by Momentive Performance Materials Inc., an average particle size of 2.0 μm) and 40 g of polymethyl methacrylate (PMMA) particles (TECHPOLYMER manufactured by SEKISUI CHEMICAL Co., LTD., an average particle size of 8 μm) were stirred in 550 g of methyl isobutyl ketone (MIBK) first for approximately 1 hour, and were dispersed, and thus, a dispersion liquid was obtained. 50 g of an acrylate-based compound (Viscoat 700HV manufactured by Osaka Organic Chemical Industry. Ltd.) and 40 g of an acrylate-based compound (8BR500 manufactured by TAISEI FINE CHEMICAL CO., LTD.) were added to obtained dispersion liquid, and the materials were further stirred. 1.5 g of a photopolymerization initiator (IRGACURE (registered trademark) 819 manufactured by BASF SE) and 0.5 g of a fluorine-based surfactant (FC4430 manufactured by 3M Company) were further added, and thus, a coating solution (a polymerizable composition for forming a light scattering layer) was prepared.

—Application and Curing of Polymerizable Composition for Forming Light Scattering Layer—

The coating solution was applied with a die coater such that the surface of the PET film of the barrier film 1 with a first overcoat layer became a coating surface. A wet coating amount was adjusted by a feed pump, and coating was performed in a coating amount of 25 cc/m$^2$ (the thickness was adjusted to be approximately 12 μm in a dried film). After the film passed through a drying zone at 60° C. for 3 minutes, the film was wound around a backup roll of which the temperature was adjusted to 30° C., was cured with an ultraviolet ray of 600 mJ/cm$^2$, and then, was wound. Thus, a light scattering layer laminated barrier film 1-A was obtained. In the same way, the barrier film 2 with a second overcoat layer (containing an antioxidant) was used to obtain a light scattering layer laminated barrier film 2-A.

(Preparation of Uneven Layer Laminated Barrier Films 1-B and 2-B)

—Preparation of Polymerizable Composition for Forming Mat Layer—

As particles for forming unevenness of a mat layer, 190 g of silicone resin particles (TOSPEARL 2000b manufactured by Momentive Performance Materials Inc., an average particle size of 6.0 μm) were stirred in 4700 g of methyl ethyl ketone (MEK) first for approximately 1 hour, and were dispersed, and thus, a dispersion liquid was obtained. 430 g of an acrylate-based compound (A-DPH manufactured by Shin Nakamura Chemical Co., Ltd.), 800 g of an acrylate-based compound (8BR930 manufactured by TAISEI FINE CHEMICAL CO., LTD.) were added to the obtained dispersion liquid and the materials were further stirred. 40 g of a photopolymerization initiator (IRGACURE BASF (registered trademark) 184 manufactured by BASF SE) was added and thus a coating solution was prepared.

—Application and Curing of Polymerizable Composition for Forming Mat Layer—

The coating solution was applied with a die coater such that the surface of the PET film of the barrier film 1 with a first overcoat layer became a coating surface. A wet coating amount was adjusted by a feed pump, and coating was performed in a coating amount of 10 cc/m$^2$. The prepared coating solution was allowed to pass through a drying zone at 80° C. for 3 minutes and then the layer was wounded around a backup roll of which the temperature was adjusted to 30° C., was cured with an ultraviolet ray of 600 mJ/cm$^2$, and then, was wound. A mat layer formed after curing had a thickness of about 3 to 6 μm and a surface roughness in which the maximum cross section height Rt (measured in accordance to JIS B0601) was about 1 to 3 μm. Thus, an uneven layer laminated barrier film 1-B was obtained. In the same way, the barrier film 2 with a second overcoat layer (containing an antioxidant) was used to obtain an uneven layer laminated barrier film 2-B.

(Preparation of Quantum Dot-Containing Polymerizable Composition)

A composition having the following composition was prepared, was filtered through a polypropylene filter having a pore diameter of 0.2 μm, and then was dried for 30 minutes under reduced pressure to prepare each of quantum dot-containing polymerizable compositions 1 to 4. In the following description, a toluene dispersion liquid of quantum dots 1 having a maximum light emission wavelength of 535 nm was prepared and CZ520-100 manufactured by NN-LABS, LLC. was used. Further, a toluene dispersion liquid of quantum dots 2 having a maximum light emission wavelength of 630 nm was prepared and CZ620-100 manufactured by NN-LABS, LLC. was used. All of these quantum dots were quantum dots containing CdSe as a core, ZnS as a shell, and octadecvl amine as a ligand, and were dispersed in toluene at a concentration of 3 mass %. In the composition tables of the following compositions, the quantum dot concentration of the quantum dots 1 and 2 in the toluene dispersion liquids was 1 mass %.

In Examples and Comparative Examples, for convenience sake, the quantum dot-containing polymerizable compositions do not include an antioxidant and the antioxidant and the content thereof are shown as a component in the precursor layer as shown in Table 1.

Quantum Dot-Containing Polymerizable Composition 1

| | |
|---|---|
| Toluene dispersion liquid of quantum dots 1 (maximum light emission wavelength: 535 nm) | 10 parts by mass |
| Toluene dispersion liquid of quantum dots 2 (maximum light emission wavelength: 630 nm) | 1 part by mass |
| Lauryl methacrylate | 80.8 parts by mass |
| Trimethylol propane triacrylate | 18.2 parts by mass |
| Photopolymerization initiator (IRGACURE 819(manufactured by BASF SE)) | 1 part by mass |

Quantum Dot-Containing Polymerizable Composition 2

| | |
|---|---|
| Toluene dispersion liquid of quantum dots 1 (maximum light emission wavelength: 535 nm) | 10 parts by mass |
| Toluene dispersion liquid of quantum dots 2 (maximum light emission wavelength: 630 nm) | 1 part by mass |
| Alicyclic epoxy compound I | 99 parts by mass |
| Photocationic polymerization initiator (iodonium salt compound) A | 1 part by mass |

Quantum Dot-Containing Polymerizable Composition 3

| | |
|---|---|
| Toluene dispersion liquid of quantum dots 1 (maximum light emission wavelength: 535 nm) | 10 parts by mass |
| Lauryl methacrylate | 80.8 parts by mass |
| Trimethylol propane triacrylate | 18.2 parts by mass |
| Photopolymerization initiator (IRGACURE 819(manufactured by BASF SE)) | 1 part by mass |

Quantum dot-containing polymerizable composition 4

| | |
|---|---|
| Toluene dispersion liquid of quantum dots 2 (maximum light emission wavelength: 630 nm) | 10 parts by mass |
| Lauryl methacrylate | 80.8 parts by mass |
| Trimethylol propane triacrylate | 18.2 parts by mass |
| Photopolymerization initiator (IRGACURE 819(manufactured by BASF SE)) | 1 part by mass |

Preparation of Wavelength Conversion Member (Examples 1 to 11 and 16 to 26)

The uneven layer laminated barrier film 2-B with the second barrier overcoat layer containing the antioxidant in each example was prepared and the quantum dot-containing polymerizable composition containing an antioxidant in each example shown in Table 1 was applied to the surface of the second barrier overcoat layer using a die coater while being continuously transported at 1 m/min with a tension of 60 N/m. As a result, a coating film having a thickness of 50 μm was formed. Next, the barrier film in which the coating film was formed was wound around the backup roller, and the barrier film 1-A with the first barrier overcoat layer was laminated on the coating film such that the first barrier overcoat layer faced the coating film. Then, the laminate was wound around the backup roller in a state where the coating film was interposed between the barrier films and was irradiated with ultraviolet light while being continuously transported.

The diameter ϕ of the backup roller was 300 mm, and the temperature of the backup roller was 50° C. The irradiation dose of ultraviolet light was 2000 mJ/cm². In addition, L1 was 50 mm, L2 was 1 mm, and L3 was 50 mm.

The coating film was cured by irradiation with ultraviolet light to form a cured layer (wavelength conversion layer). As a result, a laminated film (wavelength conversion member) was manufactured. The thickness of the cured layer in the laminated film was 50±2 μm. The thickness accuracy of the cured layer was excellent at ±4%. In addition, wrinkling was not observed on the laminated film.

Preparation of Wavelength Conversion Member (Example 12)

The uneven layer laminated barrier film 1-B with the first barrier overcoat layer was prepared and the quantum dot-containing polymerizable composition containing the antioxidant in each example shown in Table 1 was applied to the surface of the first barrier overcoat layer using a die coater while being continuously transported at 1 m/min with a tension of 60 N/m. Thus, a coating film having a thickness of 50 μm was formed. Next, the barrier film in which the coating film was formed was wound around the backup roller, and the barrier fihn 2-A with the second barrier overcoat layer containing the antioxidant in each example was laminated on the coating film such that the second barrier overcoat layer faced the coating film. Then, the laminate was wound around the backup roller in a state where the coating film was interposed between the barrier films and was irradiated with ultraviolet light while being continuously transported. The conditions of diameter and the temperature of the backup roller, ultraviolet irradiation dose, and L1, L2, and L3 were the same as in Example 1. The thickness of the cured layer of the laminated film was 50±2 μm. The thickness accuracy of the cured layer was excellent at ±4%. In addition, wrinkling was not observed on the laminated film.

Preparation of Wavelength Conversion Member (Example 13)

The uneven layer laminated barrier film 2-B with the second barrier overcoat layer was prepared and the quantum dot-containing polymerizable composition 1 containing the antioxidant in each example shown in Table 1 was applied to the surface of the second barrier overcoat layer using a die coater while being continuously transported at 1 m/min with a tension of 60 N/m. Thus, a coating film having a thickness of 50 µm was formed. Next, the barrier film in which the coating film was formed was wound around the backup roller, and the barrier film 2-A with the second barrier overcoat layer containing the antioxidant in each example was laminated on the coating film such that the second barrier overcoat layer faced the coating film. Then, the laminate was wound around the backup roller in a state where the coating film was interposed between the barrier films and was irradiated with ultraviolet light while being continuously transported. The conditions of diameter and the temperature of the backup roller, ultraviolet irradiation dose, and L1, L2, and L3 were the same as in Example 1. The thickness of the cured layer of the laminated film was 50±2 µm. The thickness accuracy of the cured layer was excellent at ±4%. In addition, wrinkling was not observed on the laminated film.

Preparation of Wavelength Conversion Member
(Example 14)

The uneven layer laminated barrier film 2-B with the second barrier overcoat layer was prepared and the quantum dot-containing polymerizable composition 3 containing the antioxidant in each example shown in Table 1 was applied to the surface of the second barrier overcoat layer using a die coater while being continuously transported at 1 m/min with a tension of 60 N/m. Thus, a coating film having a thickness of 50 µm was formed. Next, the barrier film in which the coating film was formed was wound around the backup roller, and the laminate was irradiated with ultraviolet light while being continuously transported. The coating film was cured to obtain a barrier film with a wavelength conversion layer. In addition, the light scattering layer laminated barrier film 2-A with the second barrier overcoat layer was prepared and the quantwn dot-containing polymerizable composition 4 containing the antioxidant in each example shown in Table 1 was applied to the surface of the second barrier overcoat layer using a die coater while being continuously transported at 1 m/min with a tension of 60 N/m. As a result, a coating film having a thickness of 50 µm was formed. Next, the barrier film in which the coating film was formed was wound around the backup roller and the barrier film with the wavelength conversion layer formed on the coating film was laminated on the coating film such that the wavelength conversion layer was faced the coating film. Then, the laminate was wound around the backup roller in a state where the coating film was interposed between the barrier films and was irradiated with ultraviolet light while being continuously transported. The conditions of diameter and the temperature of the backup roller, ultraviolet irradiation dose, and L1, L2, and L3 were the same as in Example 1. The thickness of the cured layer of the laminated film was 50±2 µm. The thickness accuracy of the cured layer was excellent at ±4%. In addition, wrinkling was not observed on the laminated film.

Preparation of Wavelength Conversion Member
(Example 15)

A wavelength conversion member was prepared in the same manner as in Example 14 except that in the preparation method of Example 14, the quantum dot-containing polymerizable compositions 3 and 4 were switched.

Preparation of Wavelength Conversion Member
(Comparative Examples 1 to 8)

Wavelength conversion members having the following layer configurations were prepared as Comparative Examples. In Comparative Examples 1 to 4, the quantum dot-containing polymerizable composition 1 was used and in Comparative Examples 5 to 8, the quantum dot-containing polymerizable composition 2 was used.

In Comparative Examples 1 to 3 and 5 to 7, the wavelength conversion layer not including an antioxidant was used and in Comparative Examples 4 and 8, the wavelength conversion layer including an antioxidant was used.

C-1: light scattering layer laminated barrier film 1-A with first barrier overcoat layer/wavelength conversion layer/uneven layer laminated barrier film 1-B with first barrier overcoat layer C-2: light scattering layer laminated barrier film 2-A with second barrier overcoat layer/wavelength conversion layer/uneven layer laminated barrier film 1-B with first barrier overcoat layer C-3: light scattering layer laminated barrier film 2-A with second barrier overcoat layer/wavelength conversion layer/uneven layer laminated barrier film 2-B with second barrier overcoat layer C-4: light scattering layer laminated barrier film 1-A with first barrier overcoat layer/wavelength conversion layer (containing an antioxidant)/uneven layer laminated barrier film 1-B with first barrier overcoat layer (Preparation of Antioxidant-Containing Polymerizable Composition for Interlayer)

A composition having the following composition was prepared and the materials were mixed with a static mixer to prepare an antioxidant-containing polymerizable composition for an interlayer. For the antioxidant, the material with the amount of addition shown in Table 2 was added with respect to 100 parts by weight of antioxidant-containing polymerizable composition for an interlayer.

Antioxidant-Containing Polymerizable Composition for Interlayer

| Tricyclodecane dimethanol dimethacrylate | 50 parts by mass |
| Polyethylene glycol dimethacrylate (average molecular weight: 1136) | 50 parts by mass |

Antioxidant Shown in Table 2
Photopolymerization initiator (IRGACURE 819 (manufactured by BASF SE)) 1 part by mass Preparation of Wavelength Conversion Member according to Tenth Embodiment (Examples 27 to 49)

The antioxidant-containing polymerizable composition for an interlayer prepared above was provided on the overcoat layer of the above-described light diffusion layer laminated barrier film 1-A (the antioxidant added to the overcoat layer was shown in Table 2) in a cylindrical dot pattern having the diameter shown in Table 2 (the main region of 1D-11 in FIG. 15) by screen printing. Then, the composition was cured by photoirradiation and a pattern structure of an interlayer (interposing layer) having a predetermined shape was provided. Further, a mixture of the quantum dot-containing polymerizable compositions 1 and 2 shown in Table 2 and the antioxidant was applied so as to fill a space between the patterns and was dried at 80° C. for 10 minutes.

Then, the above-described uneven layer laminated barrier film 2-B (the antioxidant added to the overcoat layer was shown in Table 2) was laminated such that the overcoat layer becomes the wavelength conversion layer. The film was irradiated with ultraviolet light at an exposure dose of 1000 mJ/cm$^2$ by using an air-cooled metal halide lamp (manufactured by EYE GRAPHICS CO., LTD.) of 200 W/cm to obtain a wavelength conversion member having a wavelength conversion layer with an average thickness of 50 μm. The numerical values of the material, thickness, and width of each layer and like in each example are shown in Table 2.

Preparation of Wavelength Conversion Member According to Eleventh Embodiment (Examples 50 to 72)

A wavelength conversion member according to the eleventh embodiment was obtained through the same steps as in the preparation of the wavelength conversion member according to the tenth embodiment except that the antioxidant-containing polymerizable composition for an interlayer was applied in a reversed dot pattern having a cylindrical void having a diameter shown in Table 3 (the main region of 1D-10 in FIG. 15). The results are shown in Table 3.

(Evaluation)

—Evaluation of Low-Polymerization-Degree Component—

A composition excluding the quantum dots from the preparation method of the wavelength conversion layer in each example was prepared and under the same conditions as in each example, the composition was applied using a die coater. Thus, a coating film having a thickness of 50 μm was formed. The conditions of diameter and the temperature of the backup roller, ultraviolet irradiation dose, and L1, L2, and L3 were the same as in Example 1.

The barrier film was peeled off from the prepared coating film and 0.1 g of the cured film of the composition was scraped to form a sample for evaluation of a low-polymerization-degree component.

0.1 g of the same for evaluation of a low-polymerization-degree component was dissolved in tetrahydrofuran (THF) to have a concentration of 0.5%, and the low-polymerization-degree component was fractionated by gel permeation chromatography (GPC). Here, regarding the monomer compounds in the respective examples, a component having a molecular weight of a polymerization degree of 2 or more and 4 or less was set to a low-polymerization-degree component. In the GPC, a KF806M type column manufactured by SHOWA DENKO K. K. was mounted to a GPC device GPC-101 manufactured by SHOWA DENKO K. K. and a differential refractive index detector was used for detection. The weight-average molecular weight was obtained in terms of polystyrene.

The weight ratio of the low-polymerization-degree component in the sample was set to P and P was used as an evaluation value.

Evaluation Standards 1 mass % ≥ P: 5 (Excellent)
3 mass % ≥ P > 1 mass %: 4 (Good)
5 mass % ≥ P > 3 mass %: 3 (Fair)
10 mass % ≥ P > 5 mass %: 2 (No Good)
P > 10 mass %: 1 (Bad)

—Evaluation of Initial Brightness—

A commercially available tablet terminal ("Kindle Fire HDX 7", manufactured by Amazon.com Inc.) was disassembled to extract a backlight unit. The wavelength conversion member according to each example which was cut into a rectangular shape was placed on a light guide plate of the extracted backlight unit, and two prism sheets whose surface roughness pattern directions were perpendicular to each other were laminated thereon. The brightness of light, which was emitted from a blue light source and passed through the wavelength conversion member and the two prism sheets was measured using a brightness meter (SR3, manufactured by Topcon Corporation) provided at a distance of 740 mm perpendicular to the surface of the light guide plate. The measurement was performed at inner positions which were at a distance of 5 mm from four corners of the wavelength conversion member, and the average value (Y0) of the measured values at the four corners was set as an evaluation value.

The results are shown in Tables 1 to 3.

<Evaluation Standards>

10: 15500 ≤ Y0
9: 15000 ≤ Y0 < 15500
8: 14500 ≤ Y0 < 15000
7: 14000 ≤ Y0 < 14500
6: 13500 ≤ Y0 < 14000
5: 13000 ≤ Y0 < 13500
4: 12500 ≤ Y0 < 13000
3: 12000 ≤ Y0 < 12500
2: 11500 ≤ Y0 < 12000
1: Y0 < 11500

The evaluation standards 10 and 9 are particularly preferable (Excellent), the evaluation standards 8 and 7 are preferable (Good), and the evaluation standards 6 and 5 are durable for practical use (Fair). The evaluation standards 4 and 3 are insufficient (No Good), and the evaluation standards 2 and 1 are not durable for practical use (Bad).

—Evaluation of Brightness Deterioration Resistance—

In a room held at 25° C. and 60% RH, the wavelength conversion member according to each example was placed on a commercially available blue light source (OPSM-H150X142B, manufactured by OPTEX-FA Co., Ltd.), and was continuously irradiated with blue light for 100 hours.

After the continuous irradiation, the brightness (Y1) at the four corners of the wavelength conversion member was measured using the same method as that of the evaluation of the brightness before the continuous irradiation. A change rate (ΔY) between the brightness Y0 before the continuous irradiation and the brightness after the continuous irradiation was obtained and was set as an index for a brightness change. The results are shown in Tables 1 to 3.

$\Delta Y=(Y0-Y1)\div Y0\times 100$

<Evaluation Standards>

10: ΔY < 10
9: 10 ≤ ΔY < 12
8: 12 ≤ ΔY < 14
7: 14 ≤ ΔY < 16
6: 16 ≤ ΔY < 18
5: 18 ≤ ΔY < 21
4: 21 ≤ ΔY < 24
3: 24 ≤ ΔY < 27
2: 27 ≤ ΔY < 30
1: 30 ≤ ΔY

The evaluation standards 10 and 9 are particularly preferable (Excellent), the evaluation standards 8 and 7 are preferable (Good), and the evaluation standards 6 and 5 are durable for practical use (Fair). The evaluation standards 4 and 3 are insufficient (No Good), and the evaluation standards 2 and 1 are not durable for practical use (Bad).

—Evaluation of Wavelength Conversion Member End Portion Deterioration—

Immediately after the above-described evaluation of brightness deterioration resistance, four end portion sides of the wavelength conversion member after continuous irradiation were imaged with a microcamera under irradiation with blue light, and a distance (mm) from the end surface of the wavelength conversion member to the outermost line of the region in which the light emission of the wavelength conversion layer was confirmed was measured. The results are shown in Table 4.

—Evaluation of Film Thickness Evenness—

With respect to the four corners of the wavelength conversion member obtained in each of Examples and Comparative Examples, the thickness was measured using a contact type thickness gauge at a portion 5 mm separated toward the inner side from the end surface. The thickness measurement was carried out for 10 samples and the data of total 40 samples was obtained. The standard deviation σ of these values was obtained and film thickness evenness was determined based on the following index.

The results are shown in Table 2.

<Index>

5: σ 0.3
4: 0.3 < σ ≤ 0.5
3: 0.5 < σ ≤ 1.0
2: 1.0 < σ ≤ 3.0
1: 3.0 < σ

In a case where the evaluation grade is 2 or higher, there is no practical problem. However, in a case where the size of the backlight is 19 inches or greater as the evaluation grade is increased to 3 to 5, macroscopic display unevenness (brightness unevenness, color unevenness) due to a remarkable wavelength conversion member is improved and thus this case is preferable.

In Table 1, regarding Examples 1 to 26 and Comparative Examples 1 to 6 of the present invention, the layer configuration, the kind of matrix of the quantum dot-containing polymerizable composition in the wavelength conversion layer, the antioxidant-containing layer (the layer configuration and the composition of the antioxidant), the barrier film water vapor permeability, and the evaluation results are shown. The "mass %" in Table 1 means that the content of the antioxidant was 1 mass % with respect to the total mass of the quantum dot-containing polymerizable composition after the addition of the antioxidant. The same is applied to the following "mass %.

As shown in Tables 1 to 3, the effectiveness of the present invention was shown.

TABLE 1

| | | Wavelength conversion layer (precursor layer) | | | Overcoat layer | |
| | | Quantum dot-containing | | | | |
| | Structure | polymerizable composition | Antioxidant | Content | Antioxidant | Content |
| --- | --- | --- | --- | --- | --- | --- |
| Example 1 | 1D-1 | 1 | Ascorbic stearate | 1 wt % | Ascorbic stearate | 1 wt % |
| Example 2 | 1D-1 | 1 | Ascorbic palmitate | 1 wt % | Ascorbic palmitate | 1 wt % |
| Example 3 | 1D-1 | 1 | α-tocopherol | 1 wt % | α-tocopherol | 1 wt % |
| Example 4 | 1D-1 | 1 | ADEKA STAB LA-52 | 1 wt % | ADEKA STAB LA-52 | 1 wt % |
| Example 5 | 1D-1 | 1 | ADEKA STAB AO-20 | 1 wt % | ADEKA STAB AO-20 | 1 wt % |
| Example 6 | 1D-1 | 1 | B-3 | 1 wt % | B-3 | 1 wt % |
| Example 7 | 1D-1 | 1 | Tributyl citric acid | 1 wt % | Tributyl citric acid | 1 wt % |
| Example 8 | 1D-1 | 1 | ADEKA STAB PEP-36 | 1 wt % | ADEKA STAB PEP-36 | 1 wt % |
| Example 9 | 1D-1 | 1 | IRGANOX PS 800FD | 1 wt % | IRGANOX PS 800FD | 1 wt % |
| Example 10 | 1D-1 | 1 | Ascorbic stearate | 2.9 wt % | Ascorbic stearate | 1 wt % |
| Example 11 | 1D-1 | 1 | Ascorbic stearate | 0.3 wt % | Ascorbic stearate | 1 wt % |
| Example 12 | 1D-2 | 1 | Ascorbic stearate | 1 wt % | Ascorbic stearate | 1 wt % |
| Example 13 | 1D-3 | 1 | Ascorbic stearate | 1 wt % | Ascorbic stearate | 1 wt % |
| Example 14 | 1D-4 | 3 and 4 | Ascorbic stearate | 1 wt % | Ascorbic stearate | 1 wt % |
| Example 15 | 1D-5 | 3 and 4 | Ascorbic stearate | 1 wt % | Ascorbic stearate | 1 wt % |
| Example 16 | 1D-1 | 1 | Ascorbic stearate | 1 wt % | Ascorbic stearate | 2.9 wt % |
| Example 17 | 1D-1 | 1 | Ascorbic stearate | 1 wt % | Ascorbic stearate | 0.3 wt % |
| Example 18 | 1D-1 | 1 | Ascorbic stearate | 1 wt % | Ascorbic stearate | 1 wt % |
| Example 19 | 1D-1 | 2 | Ascorbic palmitate | 1 wt % | Ascorbic palmitate | 1 wt % |
| Example 20 | 1D-1 | 2 | α-tocopherol | 1 wt % | α-tocopherol | 1 wt % |
| Example 21 | 1D-1 | 2 | ADEKA STAB LA-52 | 1 wt % | ADEKA STAB LA-52 | 1 wt % |
| Example 22 | 1D-1 | 2 | ADEKA STAB AO-20 | 1 wt % | ADEKA STAB AO-20 | 1 wt % |
| Example 23 | 1D-1 | 2 | B-3 | 1 wt % | B-3 | 1 wt % |
| Example 24 | 1D-1 | 2 | Tributyl citric acid | 1 wt % | Tributyl citric acid | 1 wt % |
| Example 25 | 1D-1 | 2 | ADEKA STAB PEP-36 | 1 wt % | ADEKA STAB PEP-36 | 1 wt % |
| Example 26 | 1D-1 | 2 | IRGANOX PS 800FD | 1 wt % | IRGANOX PS 800FD | 1 wt % |
| Comparative Example 1 | C-1 | 1 | Not used | — | Not used | — |
| Comparative Example 2 | C-2 | 1 | Not used | — | Ascorbic stearate | 1 wt % |
| Comparative Example 3 | C-3 | 1 | Not used | — | Ascorbic stearate | 1 wt % |
| Comparative Example 4 | C-4 | 1 | Ascorbic stearate | 1 wt % | Not used | — |

TABLE 1-continued

| | | | | | | | |
|---|---|---|---|---|---|---|---|
| Comparative Example 5 | C-1 | 2 | Not used | — | Not used | — |
| Comparative Example 6 | C-2 | 2 | Not used | — | Ascorbic stearate | 1 wt % |
| Comparative Example 7 | C-3 | 2 | Not used | — | Ascorbic stearate | 1 wt % |
| Comparative Example 8 | C-4 | 2 | Ascorbic stearate | 1 wt % | Not used | — |

| | Evaluation | | | |
|---|---|---|---|---|
| | Low-polymerization-degree component | Initial brightness | Brightness deterioration resistance | Total |
| Example 1 | 5 | 5 | 4 | 14 |
| Example 2 | 5 | 5 | 5 | 15 |
| Example 3 | 5 | 5 | 5 | 15 |
| Example 4 | 4 | 4 | 5 | 13 |
| Example 5 | 5 | 4 | 5 | 14 |
| Example 6 | 4 | 5 | 4 | 13 |
| Example 7 | 5 | 5 | 4 | 14 |
| Example 8 | 4 | 5 | 5 | 14 |
| Example 9 | 5 | 4 | 4 | 13 |
| Example 10 | 3 | 5 | 5 | 13 |
| Example 11 | 5 | 5 | 3 | 13 |
| Example 12 | 4 | 5 | 4 | 13 |
| Example 13 | 4 | 5 | 5 | 14 |
| Example 14 | 5 | 5 | 4 | 14 |
| Example 15 | 5 | 5 | 4 | 14 |
| Example 16 | 5 | 4 | 5 | 14 |
| Example 17 | 5 | 4 | 3 | 12 |
| Example 18 | 5 | 5 | 4 | 14 |
| Example 19 | 5 | 5 | 5 | 15 |
| Example 20 | 5 | 5 | 5 | 15 |
| Example 21 | 4 | 4 | 5 | 13 |
| Example 22 | 5 | 4 | 5 | 14 |
| Example 23 | 4 | 5 | 4 | 13 |
| Example 24 | 5 | 5 | 4 | 14 |
| Example 25 | 4 | 5 | 5 | 14 |
| Example 26 | 5 | 4 | 4 | 13 |
| Comparative Example 1 | 4 | 4 | 1 | 9 |
| Comparative Example 2 | 4 | 3 | 2 | 9 |
| Comparative Example 3 | 3 | 3 | 3 | 9 |
| Comparative Example 4 | 3 | 2 | 4 | 9 |
| Comparative Example 5 | 4 | 4 | 1 | 9 |
| Comparative Example 6 | 4 | 3 | 2 | 9 |
| Comparative Example 7 | 3 | 3 | 3 | 9 |
| Comparative Example 8 | 3 | 2 | 4 | 9 |

TABLE 2

| | Wavelength conversion layer | | | | | Interposing layer | |
|---|---|---|---|---|---|---|---|
| | Structure | Quantum dot-containing polymerizable composition | QD | Antioxidant | Content | Vw/(Vw + Vo) | Average width of dots (mm) |
| Example 27 | 1D-11 | 1 | 1 | Ascorbic stearate | 1 wt % | 0.8 | 0.05 |
| Example 28 | 1D-11 | 1 | 1 | Ascorbic stearate | 1 wt % | 0.8 | 0.2 |
| Example 29 | 1D-11 | 1 | 1 | Ascorbic stearate | 1 wt % | 0.8 | 1 |
| Example 30 | 1D-11 | 1 | 1 | Ascorbic stearate | 1 wt % | 0.5 | 0.05 |
| Example 31 | 1D-11 | 1 | 1 | Ascorbic stearate | 1 wt % | 0.5 | 0.2 |
| Example 32 | 1D-11 | 1 | 1 | Ascorbic stearate | 1 wt % | 0.5 | 1 |
| Example 33 | 1D-11 | 1 | 1 | Ascorbic stearate | 1 wt % | 0.2 | 0.05 |
| Example 34 | 1D-11 | 1 | 1 | Ascorbic stearate | 1 wt % | 0.2 | 0.2 |
| Example 35 | 1D-11 | 1 | 1 | Ascorbic stearate | 1 wt % | 0.2 | 1 |
| Example 36 | 1D-11 | 1 | 1 | ADEKA STAB PEP-36 | 1 wt % | 0.8 | 0.05 |

TABLE 2-continued

| | | | | | | | |
|---|---|---|---|---|---|---|---|
| Example 37 | 1D-11 | 1 | 1 | ADEKA STAB PEP-36 | 1 wt % | 0.8 | 0.2 |
| Example 38 | 1D-11 | 1 | 1 | ADEKA STAB PEP-36 | 1 wt % | 0.8 | 1 |
| Example 39 | 1D-11 | 1 | 1 | ADEKA STAB PEP-36 | 1 wt % | 0.5 | 0.05 |
| Example 40 | 1D-11 | 1 | 1 | ADEKA STAB PEP-36 | 1 wt % | 0.5 | 0.2 |
| Example 41 | 1D-11 | 1 | 1 | ADEKA STAB PEP-36 | 1 wt % | 0.5 | 1 |
| Example 42 | 1D-11 | 1 | 1 | ADEKA STAB PEP-36 | 1 wt % | 0.2 | 0.05 |
| Example 43 | 1D-11 | 1 | 1 | ADEKA STAB PEP-36 | 1 wt % | 0.2 | 0.2 |
| Example 44 | 1D-11 | 1 | 1 | ADEKA STAB PEP-36 | 1 wt % | 0.2 | 1 |
| Example 45 | 1D-11 | 2 | 1 | Ascorbic stearate | 1 wt % | 0.8 | 0.05 |
| Example 46 | 1D-11 | 2 | 1 | Ascorbic stearate | 1 wt % | 0.8 | 0.2 |
| Example 47 | 1D-11 | 2 | 1 | Ascorbic stearate | 1 wt % | 0.8 | 1 |
| Example 48 | 1D-11 | 2 | 1 | Ascorbic stearate | 1 wt % | 0.5 | 0.05 |
| Example 49 | 1D-11 | 2 | 1 | Ascorbic stearate | 1 wt % | 0.2 | 0.05 |

| | Interposing layer | | Evaluation result | | | |
|---|---|---|---|---|---|---|
| | Antioxidant | Amount of antioxidant added | Low-polymerization-degree component | Evaluation of initial brightness | brightness deterioration resistance | Film thickness evenness |
| Example 27 | Ascorbic stearate | 1 wt % | 5 | 10 | 10 | 3 |
| Example 28 | Ascorbic stearate | 1 wt % | 5 | 10 | 9 | 3 |
| Example 29 | Ascorbic stearate | 1 wt % | 5 | 10 | 8 | 3 |
| Example 30 | Ascorbic stearate | 1 wt % | 5 | 8 | 10 | 4 |
| Example 31 | Ascorbic stearate | 1 wt % | 5 | 8 | 9 | 4 |
| Example 32 | Ascorbic stearate | 1 wt % | 5 | 8 | 8 | 5 |
| Example 33 | Ascorbic stearate | 1 wt % | 5 | 6 | 10 | 5 |
| Example 34 | Ascorbic stearate | 1 wt % | 5 | 6 | 9 | 5 |
| Example 35 | Ascorbic stearate | 1 wt % | 5 | 6 | 8 | 5 |
| Example 36 | ADEKA STAB PEP-36 | 1 wt % | 4 | 10 | 10 | 3 |
| Example 37 | ADEKA STAB PEP-36 | 1 wt % | 4 | 10 | 9 | 3 |
| Example 38 | ADEKA STAB PEP-36 | 1 wt % | 4 | 10 | 8 | 3 |
| Example 39 | ADEKA STAB PEP-36 | 1 wt % | 4 | 8 | 10 | 4 |
| Example 40 | ADEKA STAB PEP-36 | 1 wt % | 4 | 8 | 9 | 4 |
| Example 41 | ADEKA STAB PEP-36 | 1 wt % | 4 | 8 | 8 | 4 |
| Example 42 | ADEKA STAB PEP-36 | 1 wt % | 4 | 6 | 10 | 5 |
| Example 43 | ADEKA STAB PEP-36 | 1 wt % | 4 | 6 | 9 | 5 |
| Example 44 | ADEKA STAB PEP-36 | 1 wt % | 4 | 6 | 8 | 5 |
| Example 45 | Ascorbic stearate | 1 wt % | 5 | 9 | 10 | 3 |
| Example 46 | Ascorbic stearate | 1 wt % | 5 | 9 | 9 | 3 |
| Example 47 | Ascorbic stearate | 1 wt % | 5 | 9 | 8 | 3 |
| Example 48 | Ascorbic stearate | 1 wt % | 5 | 7 | 10 | 4 |
| Example 49 | Ascorbic stearate | 1 wt % | 5 | 5 | 10 | 5 |

TABLE 3

| | Wavelength conversion layer | | | | | Interposing layer | |
|---|---|---|---|---|---|---|---|
| | Structure | Quantum dot-containing polymerizable composition | QD | Antioxidant | Content | Vw/(Vw + Vo) | Average width of dots (mm) |
| Example 50 | 1D-10 | 1 | 1 | Ascorbic stearate | 1 wt % | 0.8 | 0.05 |
| Example 51 | 1D-10 | 1 | 1 | Ascorbic stearate | 1 wt % | 0.8 | 0.2 |
| Example 52 | 1D-10 | 1 | 1 | Ascorbic stearate | 1 wt % | 0.8 | 1 |
| Example 53 | 1D-10 | 1 | 1 | Ascorbic stearate | 1 wt % | 0.5 | 0.05 |
| Example 54 | 1D-10 | 1 | 1 | Ascorbic stearate | 1 wt % | 0.5 | 0.2 |
| Example 55 | 1D-10 | 1 | 1 | Ascorbic stearate | 1 wt % | 0.5 | 1 |
| Example 56 | 1D-10 | 1 | 1 | Ascorbic stearate | 1 wt % | 0.2 | 0.05 |
| Example 57 | 1D-10 | 1 | 1 | Ascorbic stearate | 1 wt % | 0.2 | 0.2 |
| Example 58 | 1D-10 | 1 | 1 | Ascorbic stearate | 1 wt % | 0.2 | 1 |
| Example 59 | 1D-10 | 1 | 1 | ADEKA STAB PEP-36 | 1 wt % | 0.8 | 0.05 |
| Example 60 | 1D-10 | 1 | 1 | ADEKA STAB PEP-36 | 1 wt % | 0.8 | 0.2 |
| Example 61 | 1D-10 | 1 | 1 | ADEKA STAB PEP-36 | 1 wt % | 0.8 | 1 |
| Example 62 | 1D-10 | 1 | 1 | ADEKA STAB PEP-36 | 1 wt % | 0.5 | 0.05 |
| Example 63 | 1D-10 | 1 | 1 | ADEKA STAB PEP-36 | 1 wt % | 0.5 | 0.2 |
| Example 64 | 1D-10 | 1 | 1 | ADEKA STAB PEP-36 | 1 wt % | 0.5 | 1 |
| Example 65 | 1D-10 | 1 | 1 | ADEKA STAB PEP-36 | 1 wt % | 0.2 | 0.05 |
| Example 66 | 1D-10 | 1 | 1 | ADEKA STAB PEP-36 | 1 wt % | 0.2 | 0.2 |
| Example 67 | 1D-10 | 1 | 1 | ADEKA STAB PEP-36 | 1 wt % | 0.2 | 1 |
| Example 68 | 1D-10 | 2 | 1 | Ascorbic stearate | 1 wt % | 0.8 | 0.05 |
| Example 69 | 1D-10 | 2 | 1 | Ascorbic stearate | 1 wt % | 0.8 | 0.2 |
| Example 70 | 1D-10 | 2 | 1 | Ascorbic stearate | 1 wt % | 0.8 | 1 |

TABLE 3-continued

| | | | | | | | |
|---|---|---|---|---|---|---|---|
| Example 71 | 1D-10 | 2 | 1 | Ascorbic stearate | 1 wt % | 0.5 | 0.05 |
| Example 72 | 1D-10 | 2 | 1 | Ascorbic stearate | 1 wt % | 0.2 | 0.05 |

| | Interposing layer | | Evaluation result | | | |
|---|---|---|---|---|---|---|
| | | | Low-polymerization-degree component | Evaluation of initial brightness | Evaluation of brightness deterioration resistance | Film thickness evenness |
| | Antioxidant | Amount of antioxidant added | | | | |
| Example 50 | Ascorbic stearate | 1 wt % | 5 | 10 | 10 | 3 |
| Example 51 | Ascorbic stearate | 1 wt % | 5 | 10 | 9 | 3 |
| Example 52 | Ascorbic stearate | 1 wt % | 5 | 10 | 8 | 3 |
| Example 53 | Ascorbic stearate | 1 wt % | 5 | 8 | 10 | 4 |
| Example 54 | Ascorbic stearate | 1 wt % | 5 | 8 | 9 | 4 |
| Example 55 | Ascorbic stearate | 1 wt % | 5 | 8 | 8 | 4 |
| Example 56 | Ascorbic stearate | 1 wt % | 5 | 6 | 10 | 5 |
| Example 57 | Ascorbic stearate | 1 wt % | 5 | 6 | 9 | 5 |
| Example 58 | Ascorbic stearate | 1 wt % | 5 | 6 | 8 | 5 |
| Example 59 | ADEKA STAB PEP-36 | 1 wt % | 4 | 10 | 10 | 3 |
| Example 60 | ADEKA STAB PEP-36 | 1 wt % | 4 | 10 | 9 | 3 |
| Example 61 | ADEKA STAB PEP-36 | 1 wt % | 4 | 10 | 8 | 3 |
| Example 62 | ADEKA STAB PEP-36 | 1 wt % | 4 | 8 | 10 | 4 |
| Example 63 | ADEKA STAB PEP-36 | 1 wt % | 4 | 8 | 9 | 4 |
| Example 64 | ADEKA STAB PEP-36 | 1 wt % | 4 | 8 | 8 | 4 |
| Example 65 | ADEKA STAB PEP-36 | 1 wt % | 4 | 6 | 10 | 5 |
| Example 66 | ADEKA STAB PEP-36 | 1 wt % | 4 | 6 | 9 | 5 |
| Example 67 | ADEKA STAB PEP-36 | 1 wt % | 4 | 6 | 8 | 5 |
| Example 68 | Ascorbic stearate | 1 wt % | 5 | 9 | 10 | 3 |
| Example 69 | Ascorbic stearate | 1 wt % | 5 | 9 | 9 | 3 |
| Example 70 | Ascorbic stearate | 1 wt % | 5 | 9 | 8 | 3 |
| Example 71 | Ascorbic stearate | 1 wt % | 5 | 7 | 10 | 4 |
| Example 72 | Ascorbic stearate | 1 wt % | 5 | 5 | 10 | 5 |

TABLE 4

| | End portion deterioration (mm) |
|---|---|
| Example 1 | 0.3 |
| Comparative | 0.6 |
| Example 27 | 0.05 |
| Example 28 | 0.1 |
| Example 30 | 0.05 |
| Example 50 | <0.05 |
| Example 51 | 0.05 |
| Example 53 | <0.05 |

EXPLANATION OF REFERENCES

1C: light source
1D-1 to 1D-11: wavelength conversion member
2: backlight unit
2A: reflection plate
3: liquid crystal cell unit
4: liquid crystal display device
10, 20: barrier film
11, 21: support
12, 22: barrier layer
12a, 22a: organic barrier layer
12b, 22b: inorganic barrier layer
12c, 22c: barrier overcoat layer
13: unevenness imparting layer (mat layer, light diffusion layer
30: wavelength conversion layer
30A, 30B: quantum dots
30P: organic matrix
40: antioxidant-containing interposing layer
AO: antioxidant
50: pressure sensitive adhesive layer
$L_B$: excitation light (primary light, blue light)
$L_R$: red light (secondary light, fluorescence)
$L_G$: green light (secondary light, fluorescence)

What is claimed is:

1. A wavelength conversion member comprising:
   a wavelength conversion layer including at least one kind of quantum dots that are excited by excitation light to emit fluorescence and an antioxidant;
   at least one interposing layer that is formed to be adjacent to the wavelength conversion layer; and
   a barrier layer that is formed on at least one surface of the wavelength conversion layer,
   wherein at least one layer of the interposing layers is an antioxidant-containing interposing layer including the antioxidant, and
   wherein the wavelength conversion layer contains a low-polymerization-degree component having a polymerization degree of 2 or more and 4 or less, and a content of the low-polymerization-degree component in the wavelength conversion layer is 5 mass % or less.

2. The wavelength conversion member according to claim 1,
   wherein the antioxidant is at least one of a radical inhibitor, a metal deactivator, a singlet oxygen eliminator, a superoxide eliminator, or a hydroxy radical eliminator.

3. The wavelength conversion member according to claim 1,
   wherein the antioxidant is at least one of a hindered phenol compound, a hindered amine compound, a quinone compound, a hydroquinone compound, a tocopherol compound, an aspartic acid compound, or a thiol compound.

4. The wavelength conversion member according to claim 2,
wherein the antioxidant is at least one of a citric acid compound, an ascorbic acid compound, or a tocopherol compound.

5. The wavelength conversion member according to claim 1,
wherein the antioxidant-containing interposing layer is formed between the barrier layer and the wavelength conversion layer.

6. The wavelength conversion member according to claim 1,
wherein a region where the wavelength conversion layer and the antioxidant-containing interposing layer are present on the same plane is at least partially provided, and in the region, the wavelength conversion layer is partitioned by the interposing layer and scattered or the interposing layer is partitioned by the wavelength conversion layer and scattered.

7. The wavelength conversion member according to claim 6,
wherein an average width of dots of either of the wavelength conversion layer or the antioxidant-containing interposing layer, which is partitioned and scattered, is in a range of 0.05 to 1.0 mm, and a volume ratio Vw/(Vw+Vo) that is calculated by a volume Vw of the wavelength conversion layer and a volume Vo of the interposing layer in a solid region including at least the wavelength conversion layer is in a range of 0.2 to 0.8.

8. The wavelength conversion member according to claim 1,
wherein the barrier layer contains silicon oxide, silicon nitride, silicon carbide, or aluminum oxide.

9. The wavelength conversion member according to claim 1,
wherein an oxygen permeability of the barrier layer is 0.1 $cm^3/(m^2 \cdot Day \cdot atm)$ or lower.

10. The wavelength conversion member according to claim 1,
wherein the barrier layer is provided on both surfaces of the wavelength conversion layer.

11. The wavelength conversion member according to claim 1,
wherein the antioxidant-containing interposing layer is formed to be adjacent to both surfaces of the wavelength conversion layer.

12. A backlight unit comprising:
the wavelength conversion member according to claim 1; and
a light source that emits primary light to be incident on the wavelength conversion member.

13. A liquid crystal display device comprising:
the backlight unit according to claim 12; and
a liquid crystal cell unit on which light emitted from the backlight unit is incident.

14. A method of manufacturing the wavelength conversion member according to claim 1, the method comprising:
preparing a substrate in which the antioxidant-containing interposing layer is provided on a surface thereof;
disposing a precursor layer of the wavelength conversion layer which is formed of a polymerizable composition including at least one kind of quantum dots to be adjacent to the surface; and
curing the precursor layer.

15. A method of manufacturing the wavelength conversion member according to claim 1, the method comprising:
disposing a precursor layer of the wavelength conversion layer which is formed of a polymerizable composition including at least one kind of the quantum dots on a substrate;
forming a cured layer by curing the precursor layer; and
disposing the antioxidant-containing interposing layer to be adjacent to the cured layer.

* * * * *